(12) United States Patent  
Matsuhashi et al.

(10) Patent No.: US 12,372,863 B2
(45) Date of Patent: Jul. 29, 2025

(54) PHOTOMASK BLANK, METHOD FOR PRODUCING PHOTOMASK, AND PHOTOMASK

(71) Applicant: SHIN-ETSU CHEMICAL CO., LTD., Tokyo (JP)

(72) Inventors: Naoki Matsuhashi, Joetsu (JP); Ryusei Terashima, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 642 days.

(21) Appl. No.: 17/700,588

(22) Filed: Mar. 22, 2022

(65) Prior Publication Data

US 2022/0317554 A1     Oct. 6, 2022

(30) Foreign Application Priority Data

Apr. 6, 2021   (JP) .................................. 2021-064874
Mar. 4, 2022   (JP) .................................. 2022-033825

(51) Int. Cl.
*G03F 1/26*       (2012.01)
*G03F 1/80*       (2012.01)

(52) U.S. Cl.
CPC .................. *G03F 1/26* (2013.01); *G03F 1/80* (2013.01)

(58) Field of Classification Search
None
See application file for complete search history.

(56) References Cited

U.S. PATENT DOCUMENTS

| | | | |
|---|---|---|---|
| 11,971,653 B2* | 4/2024 | Matsuhashi | G03F 1/24 |
| 2002/0115003 A1* | 8/2002 | Tsukamoto | G03F 1/38 |
| | | | 428/432 |
| 2017/0068154 A1 | 3/2017 | Sasamoto et al. | |
| 2017/0068156 A1* | 3/2017 | Sasamoto | G03F 1/80 |

(Continued)

FOREIGN PATENT DOCUMENTS

| | | | | |
|---|---|---|---|---|
| CN | 109254496 A | 1/2019 | | |
| JP | 61046821 B2 * | 12/1980 | ............. | A61K 51/08 |
| JP | S62-030624 B2 | 7/1987 | | |

(Continued)

OTHER PUBLICATIONS

Machine translation of JP-61046821-B2 (Dec. 1980).*
Sep. 5, 2022 Search Report issued in European Patent Application No. 22165025.2.

*Primary Examiner* — Martin J Angebranndt
(74) *Attorney, Agent, or Firm* — Oliff PLC

(57) ABSTRACT

A photomask blank including a substrate and chromium-containing film, where the chromium-containing film has first to third layers from a substrate side remote, each containing chromium. The first layer contains oxygen and nitrogen and has 44 atom % or less chromium, 30 atom % or more oxygen, 26 atom % or less nitrogen, and thickness of 8 to 20 nm. The second layer contains nitrogen and 66 to 92 atom % Cr, 8 to 34 atom % N, and thickness of 40 to 70 nm. The third layer further contains oxygen and nitrogen and has 44 atom % or less Cr, 30 atom % or more O, 26 atom % or less N, and thickness of 10 nm or less. Thus, a photomask blank has a chromium-containing film with good surface roughness with defects of 50 nm, low resistivity for foreign matter adherence, and reads a barcode pattern.

18 Claims, 6 Drawing Sheets

(56) References Cited

U.S. PATENT DOCUMENTS

2019/0056653 A1    2/2019   Kawahara et al.
2019/0369482 A1    12/2019   Inazuki et al.

FOREIGN PATENT DOCUMENTS

| | | | | | |
|---|---|---|---|---|---|
| JP | 04371953 | A | * | 12/1992 | |
| JP | 2002287330 | A | * | 10/2002 | ............... G03F 1/46 |
| JP | 2003248298 | A | * | 9/2003 | |
| JP | 2004053663 | A | * | 2/2004 | |
| JP | 2013238629 | A | * | 11/2013 | |
| JP | 2019-020712 | A | | 2/2019 | |
| JP | 2021056401 | A | * | 4/2021 | ............... G03F 1/38 |
| KR | 2019078506 | A | * | 7/2019 | ............... G03F 1/26 |

\* cited by examiner

[FIG. 1]
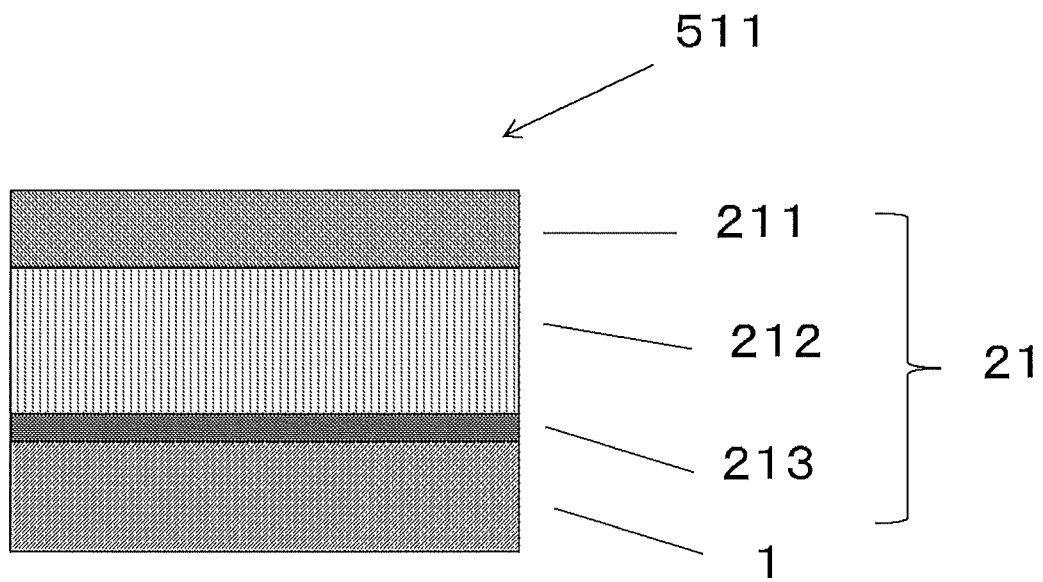
[FIG. 2]
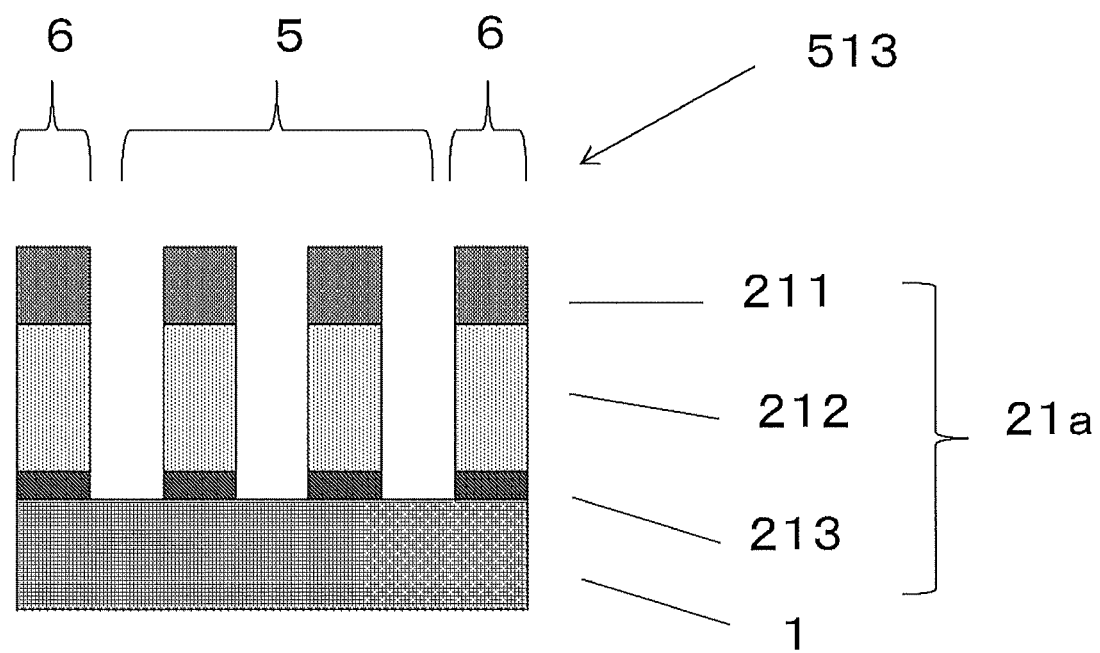

[FIG. 3]
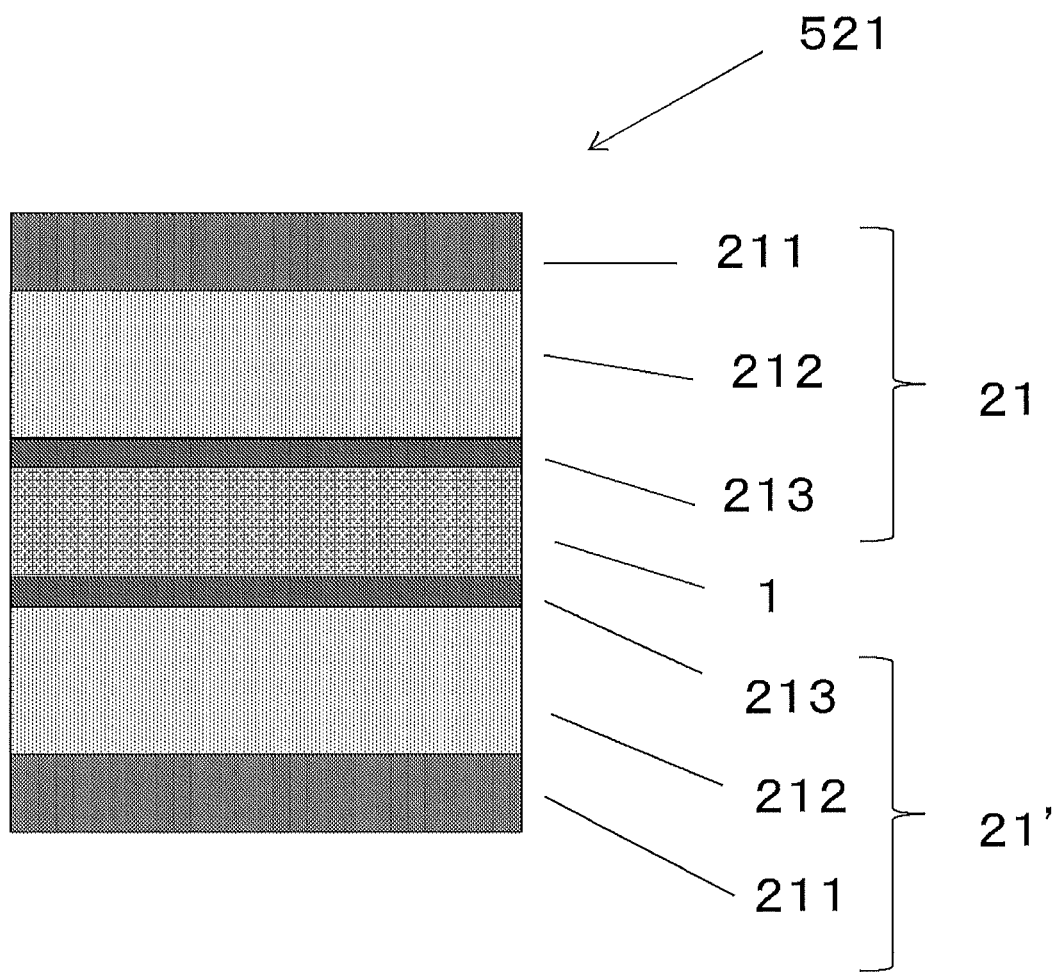

[FIG. 4]
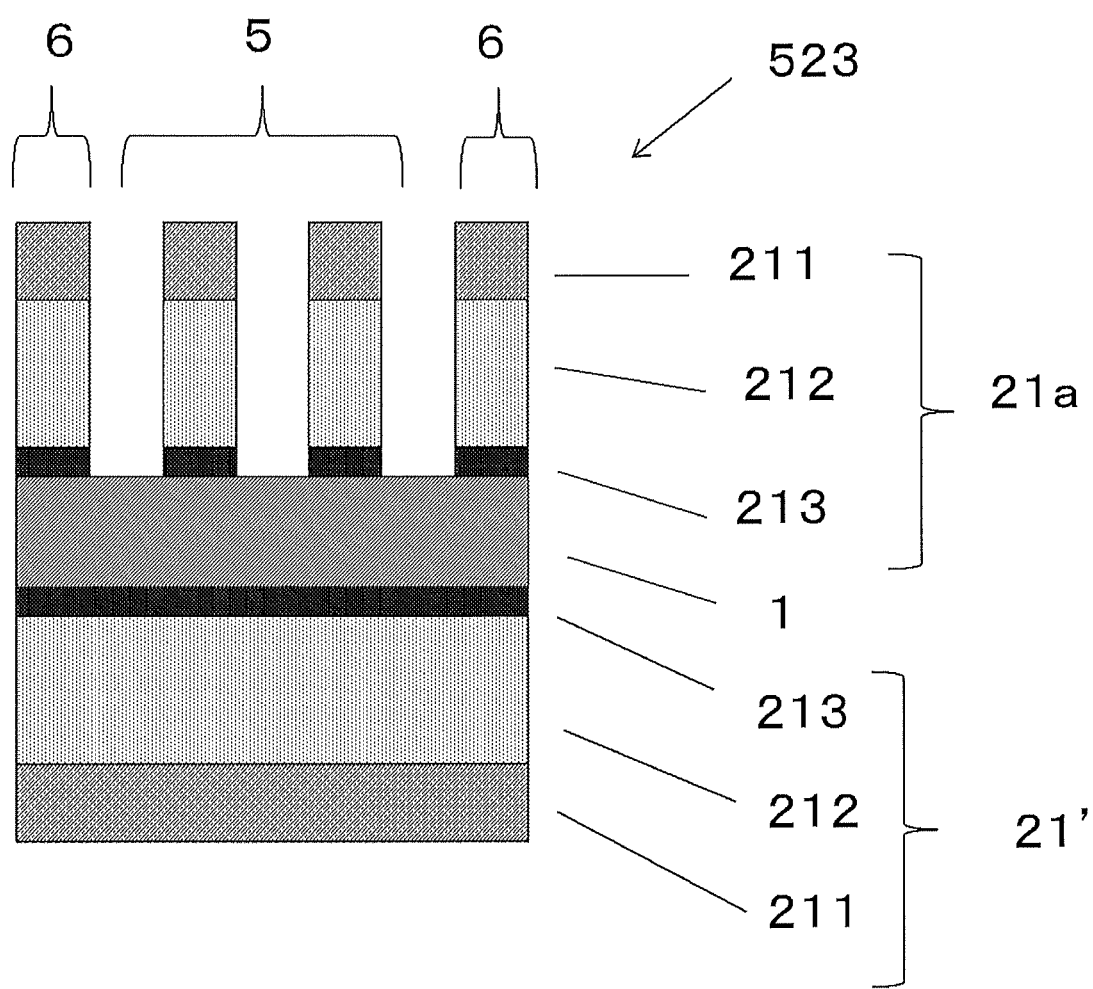

[FIG. 5]
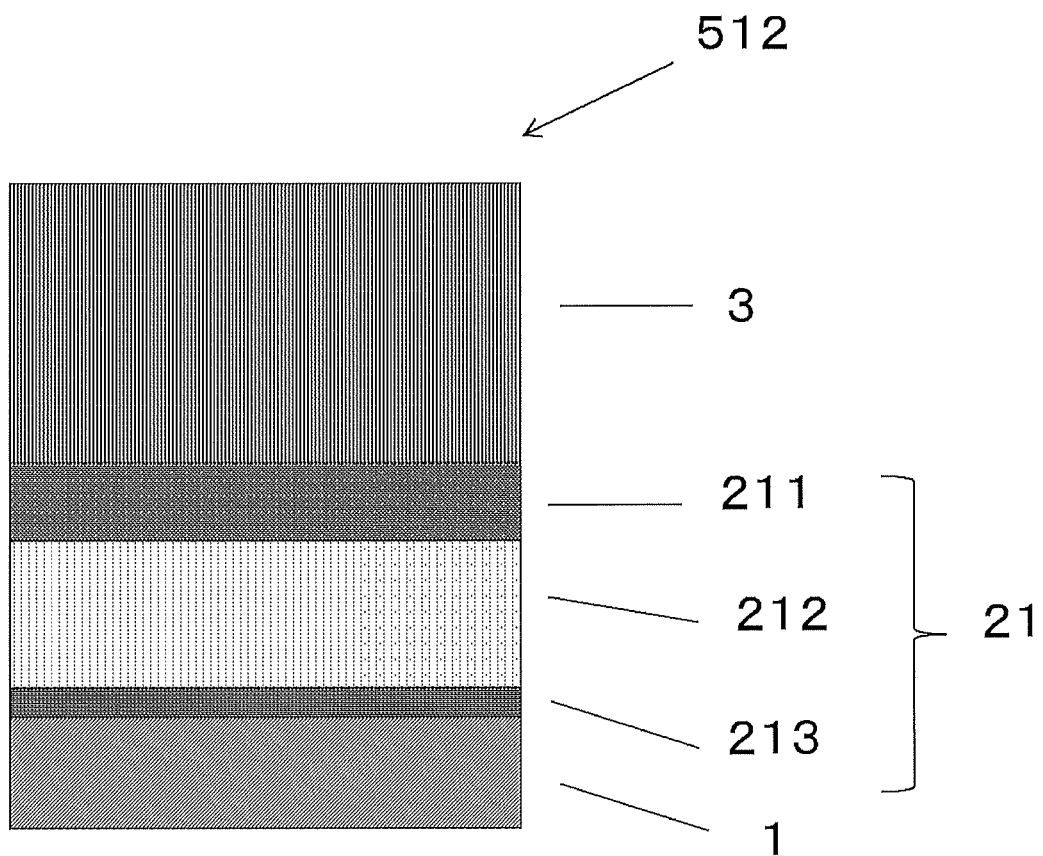

[FIG. 6]
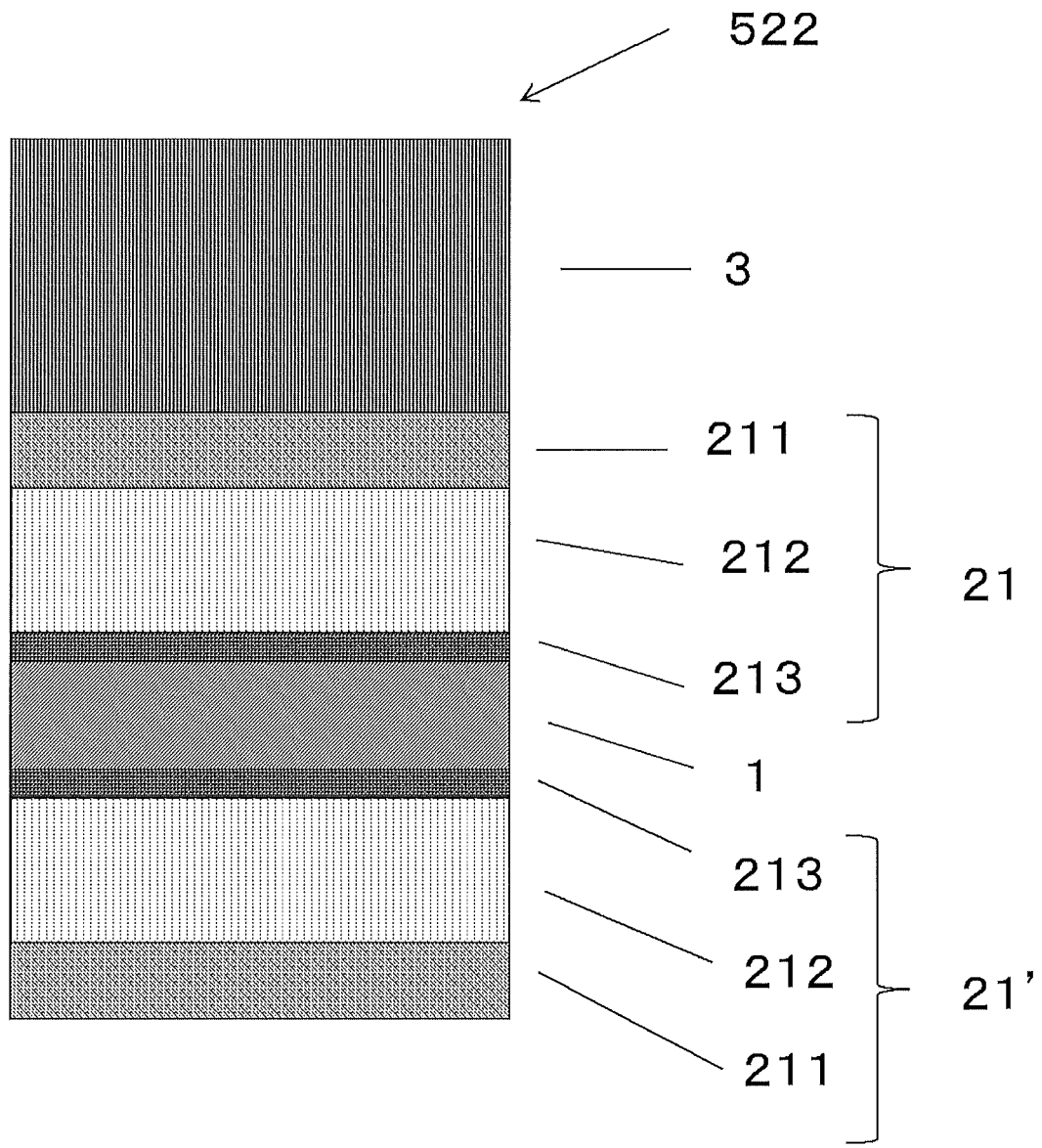

[FIG. 7]
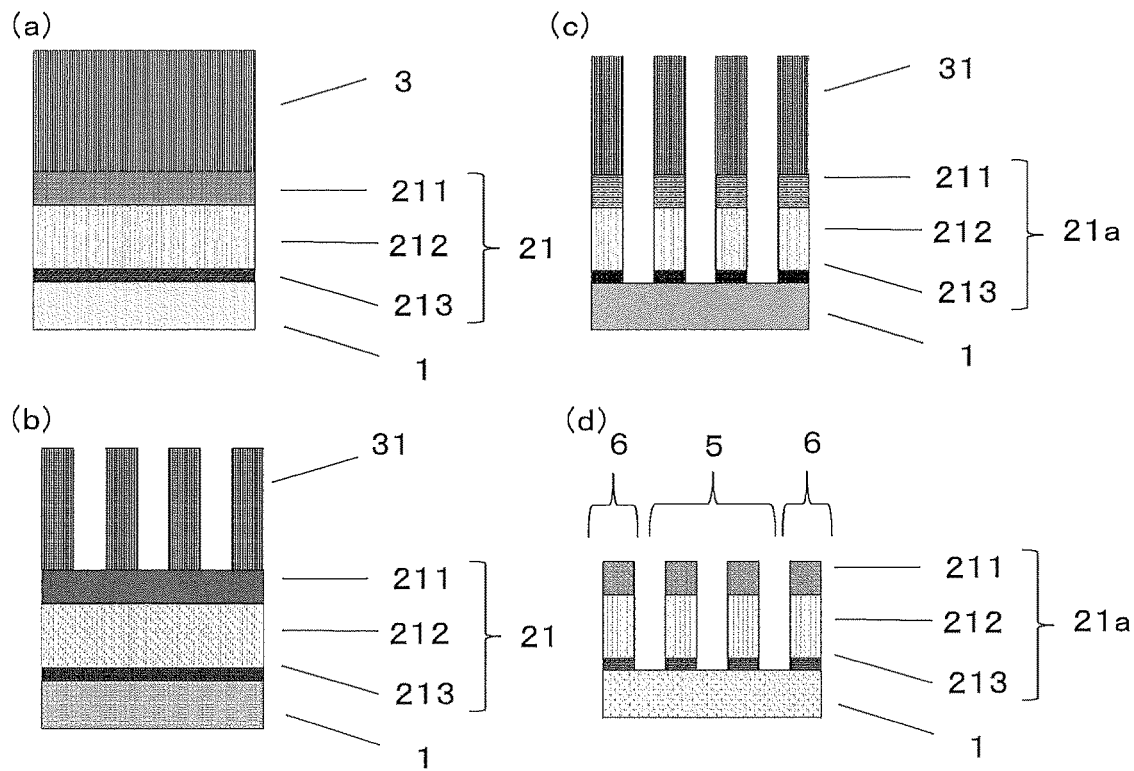
[FIG. 8]
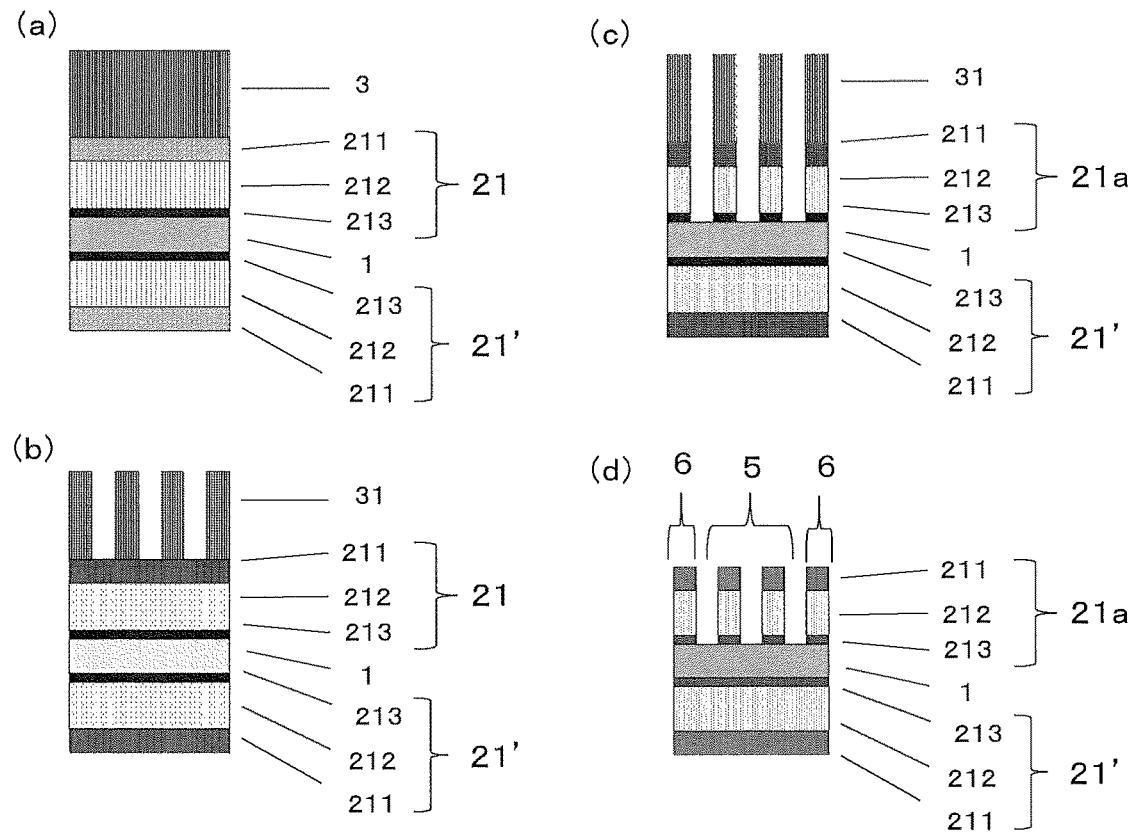

PHOTOMASK BLANK, METHOD FOR PRODUCING PHOTOMASK, AND PHOTOMASK

TECHNICAL FIELD

The present invention relates to: a photomask blank (in particular, a photomask blank that is used for producing semiconductor devices, etc. and controlling production apparatuses); a method for producing a photomask using the same; and a photomask.

BACKGROUND ART

In recent years, accompanying the miniaturization of semiconductor devices, in particular, due to higher integration of large-scale integrated circuits, higher pattern resolution is required in projection exposure. Accordingly, in photomasks, a phase shift mask has been developed as a means for improving the resolution of transferred patterns. The principle of a phase shift method is as follows. Adjustments are made so that the phase of a transmitted light that has passed through an opening in a photomask is inverted by about 180 degrees from the phase of a transmitted light that has passed through a portion adjacent to the opening. Thus, the light intensity in the boundary is lowered by the transmitted lights interfering with one another. As a result, the resolution and depth of focus of the transferred pattern are improved. Photomasks that use this principle are generally called phase shift masks.

The most common phase shift mask blank that is used for a phase shift mask has a structure in which a phase shift film is laminated on a transparent substrate such as a glass substrate, and a film containing chromium (Cr) is laminated on the phase shift film. Normally, the phase shift film has a phase difference of about 175 to 185 degrees and a transmittance of about 6 to 30% to exposure light. A phase shift film formed from a film containing molybdenum (Mo) and silicon (Si) is mainstream. Meanwhile, the film containing chromium is adjusted to have a film thickness at which a desired optical density can be achieved together with the phase shift film, and the film containing chromium is used as a light-shielding film. In addition, the film containing chromium is commonly used as a hard mask film for etching the phase shift film.

More specifically, a method for forming a pattern of a phase shift mask from this phase shift mask blank involves: forming a resist film on the chromium-containing film of the phase shift mask blank; drawing a pattern on the resist film by using light or an electron beam; developing the pattern to form a resist pattern; and forming a pattern by etching the film containing chromium while using the resist pattern as an etching mask. Furthermore, the phase shift film is etched while using the pattern of the film containing chromium as an etching mask to form a phase shift film pattern, and after that, the resist pattern and the pattern of the film containing chromium are removed.

Here, the light-shielding film outside the portions having the circuit pattern of the phase shift film pattern formed is made to remain, so that the total optical density of the phase shift film and the light-shielding film is 3 or higher. Thus, a light-shielding portion on a peripheral portion of the phase shift mask (light-shielding film pattern) is achieved. This is for preventing unnecessary exposure light from leaking and irradiating a resist film on an adjacent chip positioned outside the circuit pattern when the circuit pattern is transferred to a wafer by using a wafer exposure apparatus. A common method for forming such a light-shielding film pattern involves: forming a phase shift film pattern; removing the resist pattern; then newly forming a resist film; forming a resist pattern by pattern-drawing and development; and etching the film containing chromium while using the resist pattern as an etching mask to form a light-shielding film pattern of a peripheral portion.

For phase shift masks, which require high-precision patterning, dry etching using gas plasma is mainstream for etching. Dry etching using a chlorine-based gas containing oxygen (chlorine-based dry etching) is employed for dry etching of a film containing chromium, and dry etching using a fluorine-based gas (fluorine-based dry etching) is employed for dry etching of a film containing molybdenum and silicon. In particular, in the dry etching of a film containing chromium, it is known that chemical reactivity is raised and etching speed is enhanced by using an etching gas obtained by mixing 10 to 25 volume % of an oxygen gas relative to the chlorine-based gas.

With the miniaturization of circuit patterns, technology for forming fine phase shift mask patterns is also required. In particular, an assist pattern of a line pattern, assisting the resolution of a main pattern of a phase shift mask needs to be formed smaller than the main pattern so as not to be transferred to the wafer when a circuit pattern is transferred to a wafer by using a wafer exposure apparatus. In a generation of phase shift masks having a line-and-space pattern of a circuit with a pitch of 10 nm on the wafer, the line width of an assist pattern of a line pattern on the phase shift mask is required to be about 40 nm.

Furthermore, with the miniaturization of semiconductor devices, in particular, owing to higher integration of large-scale integrated circuits, high pattern resolution is required in projection exposure, so that it has become difficult to achieve the desired pattern resolution even when using the above-described phase shift mask. Therefore, EUV lithography, which uses extreme ultraviolet region light as exposure light has come to be used.

Extreme ultraviolet region light is easily absorbed by various substances, and therefore, transmission lithography, such as conventional photolithography that uses ArF light cannot be employed. Accordingly, in EUV lithography, a catoptric system is used.

A photomask used in EUV lithography has a structure in which a reflective layer, which reflects extreme ultraviolet region light, and a layer that absorbs extreme ultraviolet region light are formed on a substrate made of glass or the like in this order. As the reflective layer, a multilayer reflective film is used, provided with high reflectance on the irradiation of the layer surface with extreme ultraviolet region light by alternately laminating a low-refractive-index film and a high-refractive-index film. As the low-refractive-index film of the multilayer reflective film, a molybdenum (Mo) layer is usually used, and as the high-refractive-index film of the multilayer reflective film, a silicon (Si) layer is usually used.

As the absorber layer, a material having a high absorption coefficient to EUV light is used. Specific examples include materials mainly containing chromium (Cr) or tantalum (Ta).

Meanwhile, the extreme ultraviolet region light that is used in EUV lithography has a wavelength of 13.5 nm. Thus, the exposure wavelength is shorter than in conventional photolithography, the wavelength of conventional ArF light being 193 nm. Therefore, it is possible to transfer finer patterns on a photomask.

On the other hand, in EUV lithography, fine foreign matter on the photomask that is not transferred by ArF lithography is also transferred, inhibiting the production of the desired pattern. Therefore, in EUV lithography, guarantee against finer defects is required compared with conventional photolithography. To achieve this, it is necessary to prevent foreign matter from being generated in a photomask production process, and a photomask blank is needed with which even finer defects can be detected than equipment control in conventional photolithography.

In equipment control of a photomask production apparatus, for example, a dry etcher, a photomask to be treated is placed on a loader, then transported to a transport chamber, and then subsequently transported to a plasma treatment chamber. If there is particle generation from a sidewall or stage inside the plasma treatment chamber and a foreign matter adheres to a circuit pattern of the photomask, the foreign matter acts as a mask that inhibits etching, and inhibits the production of the desired photomask pattern.

Therefore, in order to confirm that there is no particle generation inside the transport chamber and the plasma treatment chamber, the following inspection is carried out. A photomask blank or a transparent substrate is transported to the transport chamber and then transported to the plasma treatment chamber. Without performing a plasma treatment, the photomask blank or transparent substrate is transported to the transport chamber again, and subsequently returned to the loader. After that, increase in foreign matter and the increased positions on the surface layer of the photomask blank or transparent substrate are investigated by using a photomask blank inspection apparatus.

It is necessary to control foreign matter inside apparatuses, not only in the above-described dry etcher, but also in a resist application apparatus, an electron beam drawing apparatus, a development apparatus, a cleaning apparatus, an apparatus for inspecting the appearance of a photomask pattern, and a correction apparatus when producing a photomask. Furthermore, it is also necessary to control foreign matter inside an exposure apparatus used in a wafer exposure step. Particularly in EUV lithography, pellicles for protecting a photomask, which prevent foreign matter from adhering to a circuit pattern of a photomask has not been put to practical use, and equipment control inside the wafer exposure apparatus is necessary.

Defect inspection of a photomask blank is carried out by using a photomask blank inspection apparatus that employs an ultraviolet region light. A defect inspection apparatus for a photomask blank is equipped with a light emission means that emits light of a specific wavelength region and a detector for receiving reflected light when a surface of the photomask blank is irradiated with light emitted from the light emission means.

When using a defect inspection apparatus for a photomask blank, a lower surface reflectance of a photomask blank to be inspected allows the photomask to be irradiated with a larger quantity of light, so that the inspection with higher sensitivity can be performed. This is because if the reflectance of the photomask blank is high, the contrast between the light reflected from foreign matter and the light reflected from the film around the foreign matter is small when the light from the light emission means collides with the foreign matter and its surrounding film and the reflected light is then detected by a detector. Therefore, it is difficult to distinguish the difference between the light reflected from the foreign matter and the light reflected from the film, and the photomask cannot be irradiated with a large quantity of light from the light emission means. When a photomask is irradiated with a larger quantity of light from a light emission means, smaller defects can be detected.

Logic devices of 7-nm and 5-nm generations require a photomask blank not to have defects of 50 nm thereon and also require the photomask production apparatus not to have defects of 50 nm inside. Therefore, the above-described photomask blank for checking the state of a photomask production apparatus is required to make it possible to detect defects of 50 nm. The defect inspection apparatus for a photomask blank of 7-nm and 5-nm generation logic devices has an inspection wavelength in an ultraviolet region of about 200 nm to 400 nm.

An exposure apparatus used in a wafer exposure step is generally controlled by forming a barcode pattern on a mask edge of a photomask by lithography for photomask control. The barcode pattern is read by equipment provided with a light emission means having a wavelength of 400 nm or more and a detector for receiving the reflected light.

The wafer exposure apparatus used in EUV lithography uses a catoptric system, so that the means for reading the barcode pattern is also a catoptric system. In the case of an optical system that receives reflected light, a reflectance of 27% of light having a wavelength of 400 nm or more is necessary.

For example, in a method described in Patent Document 1, a chromium oxide layer having a comparatively small oxygen content is formed on a transparent substrate so as to contact the transparent substrate, a thick chromium oxide film having a small oxygen content is formed so as to contact the formed layer, and a thin oxygen-rich chromium oxide film having a large oxygen content is formed so as to contact the formed film to lower the surface reflectance of the film including a material containing chromium. This allows a high-sensitivity inspection.

CITATION LIST

Patent Literature

Patent Document 1: JP S62-30624 B

SUMMARY OF INVENTION

Technical Problem

Factors that impede defect inspection of a photomask blank with an inspection apparatus include problems caused by a chromium film. If the film surface roughness of a chromium film is poor, unevenness on the surface layer of the chromium film is judged as a defect, and a large number of pseudo defects are detected. In such a case, it is difficult to tell the difference between the defects that should be eliminated and the unevenness of the chromium film, so that inspection sensitivity needs to be lowered, and inspection capacity becomes insufficient.

For example, in the above-described method described in Patent Document 1, a chromium oxide layer having a comparatively small oxygen content is formed in contact with a transparent substrate, a thick chromium oxide film having a small oxygen content is formed in contact with the formed layer, and a thin oxygen-rich chromium oxide film having a large oxygen content is formed in contact with the formed film. However, it has been revealed that since the surface roughness Rq of the film including a material containing chromium is poor, the inspection sensitivity of the defect inspection apparatus for a photomask blank to a wavelength of 355 nm cannot be sufficiently raised, and defects of 50 nm cannot be stably detected.

In addition, since a film including a material containing chromium has a high resistivity, an electric charge is easily accumulated in a surface layer of the film, and foreign matter having a negative charge generated inside the photomask production apparatus is kept away from the film including a material containing chromium by Coulomb repulsion, so that foreign matter does not adhere to the surface layer of the film including a material containing chromium. Thus, if such a film including a material containing chromium is used for equipment control of a photomask production apparatus, the true state of the apparatus cannot be investigated.

Furthermore, in an exposure apparatus used in a wafer exposure step, a reflectance of 27% to a wavelength of 400 nm or more is necessary when a barcode pattern of a photomask is read by a catoptric system. However, the above-described method described in Patent Document 1 cannot satisfy this requirement.

The present invention has been made to solve the above problems, and an object thereof is to provide a photomask blank which has a film including a material containing chromium having a good surface roughness Rq, can raise the inspection sensitivity of a defect inspection apparatus for a photomask blank sufficiently, allows the detection of 50-nm defects, is useful for production apparatus control since foreign matter in the surroundings inside the photomask production apparatus can be adhered owing to the resistivity of the film being low, also makes it possible to read a barcode pattern of the photomask by a catoptric system in an exposure apparatus used in a wafer exposure step, and makes it possible to produce a photomask pattern by employing a known photomask process.

Another object of the present invention is to provide a method for producing a photomask and a photomask using the photomask blank.

Solution to Problem

The present invention has been made to achieve the object, and provides a photomask blank comprising:
a substrate; and
a film including a material containing chromium, wherein the film including a material containing chromium has a first layer, a second layer, and a third layer from a side remote from the substrate,
the first layer, the second layer, and the third layer all contain chromium,
the first layer further contains oxygen and nitrogen and has a chromium content of 44 atom % or less, an oxygen content of 30 atom % or more, a nitrogen content of 26 atom % or less, and a thickness of 8 nm or more and 20 nm or less,
the second layer further contains nitrogen and has a chromium content of 66 atom % or more and 92 atom % or less, a nitrogen content of 8 atom % or more and 34 atom % or less, and a thickness of 40 nm or more and 70 nm or less, and
the third layer further contains oxygen and nitrogen and has a chromium content of 44 atom % or less, an oxygen content of 30 atom % or more, a nitrogen content of 26 atom % or less, and a thickness of 10 nm or less.

Regarding the film including a material containing chromium (hereinafter, also referred to simply as a film containing chromium), firstly, a first layer having oxygen and nitrogen contents within the above ranges is advantageous for achieving a film containing chromium having excellent surface roughness (in particular, surface roughness Rq). In addition, such ranges are advantageous for adjusting the reflectance of the film containing chromium (in particular, an aim is to achieve a reflectance of 32% or lower regarding exposure light having a wavelength of 355 nm and a reflectance of 27% or higher regarding exposure light having a wavelength of 400 nm. Hereinafter, exposure light is also referred to simply as light. The exposure light includes inspection light from an inspection apparatus).

In addition, when the thickness of the first layer is in the above range, the first layer can be made to be easily affected (regarding surface roughness, reflectance, and conductivity) by the second layer to an appropriate extent.

In the second layer, a nitrogen content within the above range is advantageous for achieving excellent surface roughness of the film containing chromium, and is also advantageous for adjusting reflectance. In addition, the content of chromium is higher than those of the first layer and the third layer, so that the conductivity of the second layer can be raised.

Furthermore, when the thickness of the second layer is within the above range, it is advantageous for achieving a reflectance of 27% or higher to light having a wavelength of 400 nm in the film containing chromium.

In the third layer, oxygen and nitrogen contents within the above ranges are advantageous for adjusting reflectance.

In addition, a thickness of the third layer within the above range is advantageous for adjusting reflectance.

Note that if the film containing chromium only has the first layer, for example, it is not possible to achieve excellent surface roughness or the adjustment of reflectance to the above target. However, since the first layer has a thickness within the above range, the first layer can also be affected by the second layer (and the third layer) as described above, and excellent surface roughness and adjustment of reflectance can be achieved.

Since the surface roughness is excellent, it is possible to prevent unevenness on the surface layer of the film containing chromium from being judged as a defect in defect inspection of a photomask blank and large amounts of such pseudo defects from being detected. Accordingly, it is not necessary to lower the inspection sensitivity to light having a wavelength of 355 nm to distinguish between defects that should be eliminated and pseudo defects. Therefore, in particular, it is possible to detect defects having a size of a 50-nm level.

In addition, regarding the adjustment of reflectance, since the reflectance of light having a wavelength of 355 nm can be adjusted to 32% or lower, irradiation with a larger quantity of light is possible in a defect inspection. Therefore, an inspection of higher sensitivity can be performed, and defects with a smaller size can be detected.

Furthermore, since the reflectance of light having a wavelength of 400 nm can be adjusted to 27% or higher, it is possible to read, by using a catoptric system, a barcode pattern formed on a mask edge for control when a photomask has been formed.

Moreover, the photomask blank has a three-layer structure in which the first layer and the third layer are positioned so as to sandwich the second layer having the high conductivity as described above, so that the resistivity of the film containing chromium can be lowered.

Since the film resistivity can be made small, foreign matter in the surroundings inside the photomask production apparatus can be adhered, so that the photomask blank is useful for controlling the production apparatus.

In addition, a known photomask process is sufficient for producing a photomask pattern from a photomask blank having such a film containing chromium.

In this event, the film including a material containing chromium can be a light-shielding film and can have a reflectance of 32% or lower to exposure light having a wavelength of 355 nm and a reflectance of 27% or higher to exposure light having a wavelength of 400 nm.

Such a photomask blank can be irradiated with a larger quantity of light in a defect inspection, and has a light-shielding film that allows inspection with higher sensitivity and also detection of defects of smaller size. In addition, a barcode pattern for controlling a photomask can be read.

Furthermore, the film including a material containing chromium can have a film thickness of 53 nm or more and 100 nm or less.

Such a photomask blank makes it possible to adjust the reflectance more certainly.

Furthermore, the film including a material containing chromium can have a resistivity of 20Ω/□ or lower.

Such a photomask blank has a low resistivity, so that surrounding foreign matter inside a photomask production apparatus can be adhered with more certainty and such a photomask blank is more useful for controlling a production apparatus.

In addition, the photomask blank can further comprise a reverse side film on a side of the substrate opposite to a side having the film including a material containing chromium, wherein the reverse side film has a first layer, a second layer, and a third layer similar to the first layer, the second layer, and the third layer of the film including a material containing chromium from a side remote from the substrate.

When the substrate is made of quartz, for example, an electric charge is easily accumulated on the surface layer of the substrate, so that foreign matter generated inside the photomask production apparatus cannot be easily adhered. However, when the above-described reverse side film is provided, in addition to the film including a material containing chromium, on the side opposite to the film including a material containing chromium as described above, foreign matter can be easily adhered to the side having the reverse side film as well. Thus, the photomask blank can be made more useful for controlling a production apparatus.

In addition, the present invention provides a method for producing a photomask having a circuit pattern of the film including a material containing chromium from the above-described photomask blank, the method comprising the steps of:

(A) forming a resist film on the film including a material containing chromium on a side remote from the substrate;

(B) forming a resist pattern by patterning the resist film;

(C) forming a pattern of the film including a material containing chromium by dry-etching the film including a material containing chromium by using a chlorine-based gas containing oxygen for patterning while using the resist pattern as an etching mask; and (D) removing the resist pattern.

In this manner, it is possible to produce a photomask that has good surface roughness, allows the detection of defects having a size of 50 nm in defect inspection, foreign matter inside a production apparatus can adhere to, and whose barcode pattern can be read.

The present invention also provides a photomask comprising:

a substrate; and a film including a material containing chromium, provided on the substrate and having an effective region that is a circuit pattern, wherein the film including a material containing chromium has a first layer, a second layer, and a third layer from a side remote from the substrate, the first layer, the second layer, and the third layer all contain chromium, the first layer further contains oxygen and nitrogen and has a chromium content of 44 atom % or less, an oxygen content of 30 atom % or more, a nitrogen content of 26 atom % or less, and a thickness of 8 nm or more and 20 nm or less, the second layer further contains nitrogen and has a chromium content of 66 atom % or more and 92 atom % or less, a nitrogen content of 8 atom % or more and 34 atom % or less, and a thickness of 40 nm or more and 70 nm or less, and the third layer further contains oxygen and nitrogen and has a chromium content of 44 atom % or less, an oxygen content of 30 atom % or more, a nitrogen content of 26 atom % or less, and a thickness of 10 nm or less.

Such a photomask has good surface roughness, makes it possible to detect defects having a size of 50 nm in defect inspection, allows the adhesion of foreign matter inside a production apparatus, and allows a barcode pattern to be read. Moreover, the photomask pattern can be produced from a photomask blank by a known photomask process.

Advantageous Effects of Invention

The inventive photomask blank has a film including a material containing chromium having excellent surface roughness, and 50-nm defects can be detected without detecting pseudo defects even when the inspection sensitivity of the photomask blank inspection apparatus is raised. In particular, reflectance to inspection light having a wavelength of 400 nm is 27% or higher, so that barcode patterns can be read. In addition, since the film has a low resistivity, surrounding foreign matter can be adhered. In particular, since the above-described film including a material containing chromium is laminated on both sides of the substrate, foreign matter can be adhered on the upper surface and the lower surface of the photomask blank.

BRIEF DESCRIPTION OF DRAWINGS

FIG. 1 is a cross-sectional view showing an example of a first embodiment (photomask blank) of the inventive photomask blank.

FIG. 2 is a cross-sectional view showing an example of a first embodiment (photomask) of the inventive photomask.

FIG. 3 is a cross-sectional view showing an example of a second embodiment (photomask blank) of the inventive photomask blank.

FIG. 4 is a cross-sectional view showing an example of a second embodiment (photomask) of the inventive photomask.

FIG. 5 is a cross-sectional view showing another example of the first embodiment (photomask blank) of the inventive photomask blank.

FIG. 6 is a cross-sectional view showing another example of the second embodiment (photomask blank) of the inventive photomask blank.

FIG. 7 (*a*) to (*d*) are cross-sectional views for describing the steps of the present invention for producing a photomask from a photomask blank of the first embodiment.

FIG. 8 (*a*) to (*d*) are cross-sectional views for describing the steps of the present invention for producing a photomask from a photomask blank of the second embodiment.

DESCRIPTION OF EMBODIMENTS

As described above, regarding photomask blanks, there are problems caused by surface roughness, reflectance to light having a wavelength of 355 nm or light having a wavelength of 400 nm, and resistivity.

Accordingly, to solve the problems, the present inventors have earnestly studied a photomask blank including a substrate such as a transparent substrate and a film including a material containing chromium on the substrate. As a result, the present inventors have found out that for achieving excellent surface roughness of the film, in particular, a low surface reflectance to inspection light having a wavelength of 355 nm, and a reflectance of 27% or higher to inspection light having a wavelength of 400 nm, a layer containing oxygen and nitrogen containing a large amount of oxygen is excellent.

Furthermore, the present inventors have also found out the following. When the film including a material containing chromium has a low resistivity of, for example, 20Ω/□ or lower, surrounding foreign matter can be adhered. Therefore, when the film containing chromium is not a single layer, but has a layer having a good conductivity, for example, a chromium nitride layer interposed to form a three-layer structure having, for example, a chromium oxynitride layer, a chromium nitride layer, and a chromium oxynitride layer from a side remote from the substrate, the resistivity of the film can be reduced.

From these findings, the present inventors have found out that the following photomask blank is effective, and completed the present invention. That is, a photomask blank including:
  a substrate; and
  a film including a material containing chromium, where
  the film including a material containing chromium has a
    first layer, a second layer, and a third layer from a side remote from the substrate,
  the first layer, the second layer, and the third layer all contain chromium,
  the first layer further contains oxygen and nitrogen and has a chromium content of 44 atom % or less, an oxygen content of 30 atom % or more, a nitrogen content of 26 atom % or less, and a thickness of 8 nm or more and 20 nm or less,
  the second layer further contains nitrogen and has a chromium content of 66 atom % or more and 92 atom % or less, a nitrogen content of 8 atom % or more and 34 atom % or less, and a thickness of 40 nm or more and 70 nm or less, and
  the third layer further contains oxygen and nitrogen and has a chromium content of 44 atom % or less, an oxygen content of 30 atom % or more, a nitrogen content of 26 atom % or less, and a thickness of 10 nm or less.

In the following, the present embodiment will be described.

The photomask blank of the present embodiment has: a substrate; and on the substrate, a film including a material containing chromium. In the present embodiment, the film including a material containing chromium is a laminated film having a 3-layer configuration constituted by a first layer, a second layer, and a third layer from a side remote from the substrate. Note that the film including a material containing chromium may be configured from 4 or more layers, and may be configured from 5 layers or 6 layers, for example.

In addition, as described in detail later on, the film including a material containing chromium may be laminated not only on one side, but on both sides of the substrate.

(Regarding Substrate)

There are no particular restrictions to the type or size of the substrate, and a reflective photomask blank and photomask do not necessarily need to be transparent at the wavelength used as an exposure wavelength. For a transmission type photomask blank and photomask, a transparent substrate such as a quartz substrate that is transparent at the wavelength used as an exposure wavelength is adopted. For example, a 6-inch square and 0.25-inch thick substrate called a 6025 substrate specified in SEMI standard is suitable. When SI unit system is used, a 6025 substrate is usually described as a 152-mm square, 6.35-mm thick substrate.

Hereinafter, structures of the photomask blank and photomask according to the present embodiment and methods for producing a photomask from a photomask blank will be described with reference to the drawings. Identical components are given identical reference numbers, and repetitive explanation may be omitted. In addition, the drawings are sometimes shown enlarged for convenience, and the dimensional proportions of the components and so forth are not necessarily the same in reality.

FIG. 1 is a cross-sectional view showing an example of a first embodiment of the photomask blank of the present embodiment. The photomask blank 511 has, on a transparent substrate 1, a film 21 including a material containing chromium (also referred to as a film containing chromium or a film to be processed) (for example, a light-shielding film), formed so as to be in contact with the transparent substrate 1. The film 21 including a material containing chromium includes a first layer 211, a second layer 212, and a third layer 213 from a side remote from the transparent substrate. In other words, from the side of the transparent substrate 1, the third layer 213, the second layer 212, and the first layer 211 are laminated.

FIG. 2 is a cross-sectional view showing an example of a first embodiment of the photomask of the present embodiment. The photomask 513 has, on a transparent substrate 1, a pattern (light-shielding film pattern) 21*a* of a film including a material containing chromium, formed so as to be in contact with the transparent substrate 1. The light-shielding film pattern 21*a* includes a first layer 211, a second layer 212, and a third layer 213 from a side remote from the transparent substrate 1 (a third layer 213, a second layer 212, and a first layer 211 from the side of the transparent substrate 1). The photomask 513 shown in FIG. 2 can be produced from the photomask blank 511 shown in FIG. 1.

Note that in the photomask 513, the region in which a circuit pattern has been drawn is an effective region 5, and the region surrounding the effective region 5 and having no circuit pattern drawn is a light-shielding film region 6.

FIG. 3 is a cross-sectional view showing an example of a second embodiment of the photomask blank of the present embodiment. Firstly, the photomask blank 521 has, on an upper surface side of a transparent substrate 1, a film 21 including a material containing chromium (film to be processed), and includes a first layer 211, a second layer 212, and a third layer 213 from a side remote from the transparent substrate. The photomask blank 521 is further provided with a reverse side film 21' on the opposite side (lower surface side). The reverse side film 21' has, from a side remote from the transparent substrate 1, a first layer 211, a second layer 212, and a third layer 213 that are similar to the first layer 211, the second layer 212, and the third layer 213 of the film 21 including a material containing chromium on the upper surface side. That is, in this embodiment, the photomask blank has similar films including a material containing chromium on both sides of the transparent substrate 1 so as to be in contact with the transparent substrate 1.

FIG. 4 is a cross-sectional view showing an example of a second embodiment of the photomask of the present embodiment. The photomask 523 has a pattern (light-shielding film pattern) 21a of a film including a material containing chromium formed on an upper surface side of a transparent substrate 1 so as to contact the transparent substrate 1. The photomask 523 includes a first layer 211, a second layer 212, and a third layer 213 from a side remote from the transparent substrate. The photomask 523 is also further provided with a reverse side film 21' on the opposite side (lower surface side). The reverse side film 21' has, from a side remote from the transparent substrate 1, a first layer 211, a second layer 212, and a third layer 213 that are similar to the first layer 211, the second layer 212, and the third layer 213 of the film 21 including a material containing chromium on the upper surface side.

In the present embodiment, the film including a material containing chromium is a laminated film having a 3-layer configuration constituted by a first layer, a second layer, and a third layer from a side remote from the substrate. The first layer and the third layer are both composed of a material containing chromium, oxygen, and nitrogen, and the second layer is composed of a material containing chromium and nitrogen. The material containing chromium is preferably a material that has resistance to fluorine-based dry etching and that can be removed by chlorine-based dry etching.

The material of the first layer and the third layer containing chromium, oxygen, and nitrogen preferably does not contain silicon. As the material of the first layer and the third layer containing chromium, oxygen, and nitrogen, a material consisting of chromium (Cr), oxygen (O), and nitrogen (N) (CrON) is suitable.

Meanwhile, the material of the second layer containing chromium and nitrogen also preferably does not contain silicon. As the material of the second layer containing chromium and nitrogen, a material consisting of chromium (Cr) and nitrogen (N) (CrN) is suitable.

In the following, each layer will be described in further detail. Note that although description on the content of each atom, layer thickness, and advantageous effects thereof will basically be given for each layer, there are also influences between layers, and therefore, description of a different layer or relationships with the different layer may also be given along with the description of a particular layer.
(Regarding First Layer)

In the film of the present embodiment including a material containing chromium, the composition of the first layer (upper layer), which is the layer on the side remote from the substrate is as follows: a chromium content of 44 atom % or less; an oxygen content of 30 atom % or more; and a nitrogen content of 26 atom % or less. The thickness is 8 nm or more and 20 nm or less.

The first layer preferably has a chromium content of 43 atom % or less, and preferably 30 atom % or more, particularly preferably 38 atom % or more.

The first layer preferably has an oxygen content of 32 atom % or more, and preferably 60 atom % or less, particularly preferably 54 atom % or less.

The first layer preferably has a nitrogen content of 25 atom % or less, and preferably 5 atom % or more, particularly preferably 8 atom % or more.

The first layer preferably has a thickness of 18 nm or less, and preferably 10 nm or more.

When producing a photomask from a photomask blank, the first layer is a layer that directly contacts a cleaning solution, and is a layer that contacts a resist film. When performing an inspection with a photomask blank inspection apparatus, the first layer is a layer positioned on a side remote from the substrate and is a layer that light emitted from a light emission means enters. Therefore, it is required that the first layer has a high chemical resistance to cleaning solutions, and that the first layer, the second layer, and the third layer together have a reflectance of 32% or lower to inspection light having a wavelength of 355 nm and a reflectance of 27% or higher to inspection light having a wavelength of 400 nm (hereinafter, also referred to as adjustment of reflectance).

Chromium oxynitride (CrON) does not dissolve in a mixed solution of sulfuric acid and a hydrogen peroxide solution, ammonia-added water (an ammonia-added hydrogen peroxide solution, APM), or the like compared with chromium oxide (CrO), and can maintain optical characteristics stably.

In addition, chromium oxynitride (CrON) has a lower reflectance to exposure light than chromium nitride (CrN). Therefore, chromium oxynitride is advantageous for providing the film including a material containing chromium with a reflectance of 32% or lower to inspection light having a wavelength of 355 nm.

From these viewpoints, it is advantageous to compose the first layer from a material containing chromium, oxygen, and nitrogen and to provide the first layer with the above-described predetermined composition, which has a comparatively high oxygen content and is an oxygen-rich composition (a chromium content of 44 atom % or less, an oxygen content of 30 atom % or more, and a nitrogen content of 26 atom % or less).

Furthermore, chromium oxynitride (CrON) allows better surface roughness Rq of the film than chromium oxide (CrO). From such a viewpoint, it is advantageous to provide the first layer with the above-described predetermined composition, which has comparatively high oxygen and nitrogen contents and is an oxygen- and nitrogen-rich composition (a chromium content of 44 atom % or less, an oxygen content of 30 atom % or more, and a nitrogen content of 26 atom % or less).

In addition, the thickness of the first layer is set to 20 nm or less as described above from viewpoints of the surface roughness Rq, reflectance, and resistivity of the film including a material containing chromium as described below.

On the other hand, if the thickness is too thin, there is risk of the first layer being excessively affected by the second layer, and therefore, the thickness is set to 8 nm or more as described above.

The first layer as described above can be influenced by the second layer (and the third layer) to an appropriate extent, and is advantageous for obtaining a film containing chromium in which excellent surface roughness, appropriate adjustment of reflectance, and reduction of resistivity have been achieved.

(Regarding Second Layer)

In the film of the present embodiment including a material containing chromium, the composition of the second layer, which is the layer sandwiched between the first layer and the third layer is as follows: a chromium content of 66 atom % or more and 92 atom % or less; and a nitrogen content of 8 atom % or more and 34 atom % or less. The thickness is 40 nm or more and 70 nm or less.

The second layer particularly preferably has a chromium content of 70 atom % or more and 90 atom % or less.

The second layer preferably has a nitrogen content of 30 atom % or less, and particularly preferably 10 atom % or more.

In addition, concerning a photomask blank inspection apparatus, when the reflectance of the film including a material containing chromium to inspection light emitted from a light emission means is higher, it is not possible to irradiate the photomask blank with a greater quantity of light, so that it becomes necessary to lower the inspection sensitivity. From this viewpoint, reflectance to exposure light having a wavelength of 355 nm is desirably 32% or less, particularly desirably 30% or less.

In addition, in order to control a photomask, it is common to form a barcode pattern on a mask edge of a photomask by photolithography by using an exposure apparatus used in a wafer exposure step and to control the photomask by using the information in the barcode. The barcode pattern is read by an apparatus including a means for emitting light having a wavelength of 400 nm or more and a detector for receiving the reflected light.

When receiving the reflected light, the film including a material containing chromium needs a reflectance of 27% to inspection light having a wavelength of 400 nm or more. From this viewpoint, the reflectance to inspection light having a wavelength of 400 nm is desirably 27% or more.

Furthermore, to satisfy the above-described reflectance (especially reflectance of 400-nm light), the second layer has a thickness of 40 nm or more and 70 nm or less, particularly preferably 44 nm or more and 68 nm or less.

When chromium nitride is nitrogen-rich chromium nitride, having a large nitrogen content, the film has excellent surface roughness Rq. From such a viewpoint, it is advantageous to provide the second layer with the above-described predetermined composition, which has a comparatively high nitrogen content and is a nitrogen-rich composition (a chromium content of 66 atom % or more and 92 atom % or less and a nitrogen content of 8 atom % or more and 34 atom % or less). Furthermore, when the contents are within the above-described more preferable ranges, excellent surface roughness can be provided with more certainty.

In addition, since the second layer is in contact with the first layer, a thinner first layer is affected more by the surface roughness Rq of the second layer. Therefore, it is advantageous for the thickness of the first layer to be 20 nm or less as described above (provided the thickness is 8 nm or more).

When the chromium nitride is more nitrogen-rich, reflectance to inspection light having a wavelength of 355 nm becomes low, and since the second layer is formed adjacent to the first layer, the second layer has an influence on the reflectance to inspection light having a wavelength of 355 nm. From such a viewpoint alone, it is advantageous to provide the second layer with the predetermined composition described above, having a comparatively nitrogen-rich composition. However, on the other hand, when the chromium nitride contains less nitrogen, reflectance to inspection light having a wavelength of 400 nm becomes high, and since the second layer is formed adjacent to the first layer, the second layer has an influence on the reflectance to inspection light having a wavelength of 400 nm. From such viewpoints regarding light having wavelengths of 355 nm and 400 nm, it is advantageous for the second layer to have the predetermined composition (a chromium content of 66 atom % or more and 92 atom % or less and a nitrogen content of 8 atom % or more and 34 atom % or less).

When the film including a material containing chromium is transported into a photomask production apparatus, the film is exposed to the atmosphere inside the photomask production apparatus. If the film including a material containing chromium has a high resistivity, an electric charge is easily accumulated on a surface layer of the film including a material containing chromium, so that foreign matter having a negative charge generated inside the photomask production apparatus is kept away from the film including a material containing chromium by Coulomb repulsion. Therefore, it is difficult for foreign matter generated inside the photomask production apparatus to be adhered, and when the photomask blank is used for the purpose of investigating the foreign matter inside the photomask production apparatus, the true state of the apparatus cannot be investigated. Accordingly, as described above, a film including a material containing chromium having a low resistivity is given as an object.

For the above-described reasons, the first layer is constituted by a material containing chromium, oxygen, and nitrogen, and has an oxygen-rich composition, having a comparatively high oxygen content. Accordingly, since chromium oxide (CrO) has a high film resistivity compared with chromium nitride (CrN), the first layer, being chromium oxynitride (CrON) having an oxygen-rich composition, has a comparatively high resistivity.

Meanwhile, for the above-described reasons, the second layer is constituted by a material containing chromium and nitrogen, and has a nitrogen-rich composition, having a comparatively high nitrogen content, but chromium content is also comparatively high (66 atom % or more and 92 atom % or less), and sheet resistivity is low. Therefore, as described above, it is advantageous to reduce the film thickness of the first layer and for the second layer to have the above-described predetermined composition, which is a composition in which the nitrogen content is comparatively high.

Regarding the resistivity of the film including a material containing chromium, the resistivity of the first layer, the second layer, and the third layer put together is preferably 20 kΩ/□ or lower, particularly preferably 18 kΩ/□ or lower, for example. Owing to the above-described characteristics of the first layer and the second layer, a film including a material containing chromium having such a resistivity can be achieved. In addition, since the second layer is in contact with the first layer, a thinner first layer receives more influence from the second layer having the high conductivity when forming the first layer, so that the first layer can be easily provided with a low-conductivity composition. Therefore, from this viewpoint, it is advantageous for the first layer to have a thickness of 20 nm or less (provided the thickness is 8 nm or more).

(Regarding Third Layer)

In the film of the present embodiment including a material containing chromium, the composition of the third layer, which is the layer on the substrate side is as follows: a chromium content of 44 atom % or less; an oxygen content of 30 atom % or more; and a nitrogen content of 26 atom % or less. The thickness is 10 nm or less.

The third layer preferably has a chromium content of 43 atom % or less, and preferably 30 atom % or more, particularly preferably 38 atom % or more.

The third layer preferably has an oxygen content of 32 atom % or more, and preferably 60 atom % or less, particularly preferably 54 atom % or less.

The third layer preferably has a nitrogen content of 25 atom % or less, and preferably 5 atom % or more, particularly preferably 8 atom % or more.

The third layer preferably has a thickness of 1 nm or more, particularly preferably 3 nm or more.

When the third layer has oxygen and nitrogen contents within the above ranges (an oxygen content of 30 atom % or more and a nitrogen content of 26 atom % or less), it is advantageous for adjusting the reflectance of the film containing chromium.

The first layer and the second layer have the above-described restrictions, and the constitution of the third layer affects the reflectance of the film including a material containing chromium since inspection light having wavelengths of 355 nm and 400 nm reach the third layer through the first layer and the second layer.

To achieve a reflectance of 32% or less to inspection light having a wavelength of 355 nm and a reflectance of 27% or more to inspection light having a wavelength of 400 nm, the third layer has a thickness of 10 nm or less.

The inventive photomask blank as described above can provide the film containing chromium with excellent surface roughness. Since the photomask blank has excellent surface roughness, it is possible to prevent the detection of a large number of pseudo defects in defect inspection. Therefore, inspection sensitivity to light having a wavelength of 355 nm does not need to be lowered, so that sufficient inspection capacity can be achieved, and defects with a size of 50 nm, and even smaller defects can also be sufficiently detected.

In particular, since a reflectance of 32% or less to inspection light having a wavelength of 355 nm can be achieved, high-sensitivity defect inspection is possible. At the same time, since a reflectance of 27% or more to inspection light having a wavelength of 400 nm can also be achieved, the barcode pattern for controlling the photomask can be read when a photomask is formed.

In addition, the resistivity of the film containing chromium can be reduced. Therefore, foreign matter can be adhered to the photomask blank inside the photomask production apparatus, and the photomask blank is therefore useful for investigating the true state of the apparatus.

Particularly, when the film containing chromium has a low resistivity of 20Ω/□ or lower, the adhesion of the foreign matter can be made more certain, and this is even more useful for controlling a production apparatus.

Moreover, a photomask pattern can be produced by a known photomask process.

When the film including a material containing chromium is a light-shielding film, in particular, when a photomask has been formed and when the film including a material containing chromium remains as a light-shielding film in a part positioned in a peripheral portion of the substrate where a barcode pattern of the film including a material containing chromium is formed, and in addition, when the photomask is irradiated with light emitted from a light emission means and a detector for reading the barcode receives the reflected light, the reflectance of the film including a material containing chromium, which is a light-shielding film, to inspection light such as inspection light having a wavelength of 400 nm and light having a wavelength of a gallium-nitride-based laser or the like can be set to 27% or higher, particularly preferably 28% or higher as described above.

The film including a material containing chromium preferably has a film thickness (the total thickness of the first layer, the second layer, and the third layer) of 53 nm or more and 100 nm or less. When the film thickness is as described, the film including a material containing chromium can be adjusted with more certainty to have a reflectance of 32% or lower to inspection light having a wavelength of 355 nm and a reflectance of 27% or higher to inspection light having a wavelength of 400 nm. Furthermore, when the film including a material containing chromium has a film thickness of 70 nm or more and 87 nm or less, the adjustment of the reflectance can be performed even more certainly. Therefore, this range is even more preferable.

Note that when the photomask blank has a film containing chromium on both sides of the substrate as shown in FIG. 3 (i.e. a film containing chromium 21 on the upper surface side and a reverse side film 21' on the lower surface side), foreign matter can be adhered to the lower surface side in addition to the upper surface side. This is even more preferable for controlling a photomask production apparatus.

The photomask blank of the present embodiment may further have a resist film that contacts the film including a material containing chromium on a side remote from the substrate. The resist film may be an electron beam resist for drawing with an electron beam, and is particularly preferably a photoresist for drawing with light. The photoresist for drawing with light may be a negative type, but is desirably a positive type in order to leave a larger area of the film including a material containing chromium.

When forming a fine pattern, the resist film is eliminated by etching along with the film including a material containing chromium in a dry etching step. In order to prevent the resist film from being eliminated by etching before the part of the film including a material containing chromium to be processed is eliminated by etching, the film thickness of the resist film is preferably made thick. The thickness is preferably 300 nm or more, particularly preferably 400 nm or more.

FIG. 5 is a cross-sectional view showing a different example of the first embodiment of the photomask blank of the present embodiment. The photomask blank 512 has a resist film 3 formed so as to be in contact with the film 21 including a material containing chromium (film to be processed) of the photomask blank shown in FIG. 1. The photomask 513 shown in FIG. 2 can also be produced from the photomask blank 512 shown in FIG. 5.

FIG. 6 is a cross-sectional view showing a different example of the second embodiment of the photomask blank of the present embodiment. The photomask blank 522 has a resist film 3 formed so as to be in contact with the film 21 including a material containing chromium (film to be processed) of the photomask blank shown in FIG. 3. The photomask 523 shown in FIG. 4 can also be produced from the photomask blank 522 shown in FIG. 6.

In addition, the inventive photomask such as those shown in FIGS. 2 and 4 have, as described above, a film including a material containing chromium, has a composition (chromium, oxygen, and nitrogen) similar to that of the inventive photomask blank, and can achieve advantageous effects similar to those of the inventive photomask blank. That is, the photomask has excellent surface roughness, and enables the detection of defects having a size of 50 nm, adherence of foreign matter, and reading of a barcode pattern.

Hereinafter, a procedure of producing the inventive photomask blank will be described.

The formation of the film including a material containing chromium of the present embodiment on a substrate is not particularly limited. However, formation by a sputtering method is preferable since controllability is favorable and a film having a predetermined property can be easily formed. As the sputtering system, DC sputtering, RF sputtering, etc. can be applied, and there are no particular restrictions.

When a film containing chromium and not containing silicon is formed as the film including a material containing chromium, a chromium target can be used as a sputtering target.

The electric power supplied to the sputtering target can be appropriately set depending on the size of the sputtering target, cooling efficiency, how easily film formation can be controlled, etc., and usually, the power per area of the sputtering surface of the sputtering target can be 0.1 to 10 W/cm$^2$.

When forming a film of a material containing oxygen or nitrogen, the sputtering is preferably reactive sputtering. As a sputtering gas, rare gases such as a helium gas (He), a neon gas (Ne), or an argon gas (Ar), and reactive gases are used. For example, when forming a film of a material containing oxygen, an oxygen gas ($O_2$ gas) can be used as a reactive gas, and when forming a film of a material containing nitrogen, a nitrogen gas ($N_2$ gas) can be used as a reactive gas. When forming a film of a material containing both nitrogen and oxygen, an oxygen gas ($O_2$ gas) and a nitrogen gas ($N_2$ gas) may be used simultaneously as reactive gases, or a nitric oxide gas such as a nitrogen monoxide gas (NO gas), a nitrogen dioxide gas ($NO_2$ gas), or a nitrous oxide gas ($N_2O$ gas) may be used as a reactive gas.

Pressure when forming a film can be appropriately set considering film stress, chemical resistance, cleaning resistance, and so forth. Usually when pressure is set to 0.01 Pa or higher, in particular, 0.03 Pa or higher, and 1 Pa or lower, in particular, 0.3 Pa or lower, chemical resistance is improved. In addition, the flow rate of each gas can be appropriately set so as to achieve a desired composition, and usually can be 0.1 to 100 sccm.

The substrate, or the substrate and the film formed on the substrate may be subjected to a heat treatment in the process of producing a photomask blank. As methods for performing the heat treatment, infrared heating, resistance heating, etc. are applicable, and there are also no particular restrictions to conditions for the treatment. The heat treatment can be performed, for example, under a gas atmosphere containing oxygen. The concentration of the gas containing oxygen is not particularly limited, and for example, in the case of an oxygen gas ($O_2$ gas), can be 1 to 100 volume %. The temperature of the heat treatment is preferably 200° C. or higher, particularly preferably 400° C. or higher. In addition, in the process of producing a photomask blank, a film formed on a substrate, in particular, a film including a material containing chromium may be subjected to an ozone treatment, a plasma treatment, etc. and conditions for the treatment are not particularly restricted. Any of these treatments can be performed for the purpose of increasing the oxygen concentration on the surface of the film, and in such a case, the treatment conditions can be adjusted appropriately so as to achieve a predetermined oxygen concentration. Note that when a film is formed by sputtering, the oxygen concentration on the surface of the film can be increased by adjusting the proportion of a rare gas and a gas containing oxygen (oxidizing gas) such as an oxygen gas ($O_2$ gas), a carbon monoxide gas (CO gas), or a carbon dioxide gas ($CO_2$ gas) in the sputtering gas.

In the process of producing a photomask blank, a cleaning treatment may be performed in order to remove defects present on the surface of the substrate or the film formed on the substrate. Cleaning can be performed using one or both of ultrapure water and functional water which is ultrapure water containing ozone gas, hydrogen gas, etc. In addition, cleaning may be performed with ultrapure water containing a surfactant, and then further cleaning may be performed using one or both of ultrapure water and functional water. The cleaning can be performed while irradiation with ultrasonic waves as necessary, and furthermore, irradiation with UV light can also be performed in combination.

When a resist film is formed on the photomask blank of the present embodiment, the method for applying the resist film is not particularly limited, and a known technique can be applied.

Next, the inventive method for producing a photomask will be described.

A photomask is produced from the photomask blank of the present embodiment. FIG. 7 is a cross-sectional view for explaining the process of producing a phase shift mask from the phase shift mask blank of the first embodiment of the present embodiment.

In this case, firstly, as shown in FIG. 7 (a), a resist film (preferably having a film thickness of 300 nm or more, particularly preferably 400 nm or more) 3 is formed on a film including a material containing chromium (light-shielding film 21) on a side remote from the transparent substrate 1 so as to come in contact with the film (step A).

Next, as shown in FIG. 7 (b), the resist film 3 is patterned to form a resist pattern 31 (step B).

Next, as shown in FIG. 7 (c), the film including a material containing chromium (light-shielding film 21) including a first layer 211, a second layer 212, and a third layer 213 is patterned by chlorine-based dry etching (dry etching in which a chlorine-based gas containing oxygen is used) while using the resist pattern 31 as an etching mask to form a pattern of the film including a material containing chromium (light-shielding film pattern 21a) (step C).

Next, as shown in FIG. 7 (d), the remaining resist pattern 31 is removed, and thus, a photomask (phase shift mask) can be obtained (step D).

Meanwhile, FIG. 8 is a cross-sectional view for explaining the process of producing a phase shift mask from the phase shift mask blank of the second embodiment of the present embodiment.

In this case, firstly, as shown in FIG. 8 (a), a resist film (preferably having a film thickness of 300 nm or more, particularly preferably 400 nm or more) 3 is formed on a film including a material containing chromium (light-shielding film 21) on the upper surface side on a side remote from the transparent substrate 1 so as to come in contact with the film (step A).

Next, as shown in FIG. 8 (b), the resist film 3 is patterned to form a resist pattern 31 (step B).

Next, as shown in FIG. 8 (c), the film including a material containing chromium (light-shielding film 21) including a first layer 211, a second layer 212, and a third layer 213 is patterned by chlorine-based dry etching (dry etching using a chlorine-based gas containing oxygen) while using the resist pattern 31 as an etching mask to form a pattern of the film including a material containing chromium (light-shielding film pattern 21a) (step C).

Next, as shown in FIG. 8 (d), the remaining resist pattern 31 is removed, and thus, a photomask (phase shift mask) can be obtained (step D).

When inspecting a photomask with an apparatus for inspecting the appearance of a photomask pattern, an alignment mark is necessary. In this event, the photomask of the present embodiment is particularly effective in photolithography for forming an alignment pattern of 500 nm to 50000 nm on a substrate to be processed, when exposing the photoresist film formed on the substrate to be processed by using exposure light such as an ArF excimer laser (wavelength: 193 nm), in particular, exposure light having a wavelength of 300 nm or more to transfer the pattern.

An exposure apparatus used in a wafer exposure step forms a barcode pattern on a mask edge of a mask by lithography for controlling a photomask to control the photomask.

The photomask of the present embodiment is particularly effective in photolithography for forming a barcode pattern of 100 μm or more on a substrate to be processed, when exposing the photoresist film formed on the substrate to be processed by using exposure light such as an ArF excimer laser (wavelength: 193 nm), in particular, exposure light having a wavelength of 300 nm or more to transfer the pattern.

EXAMPLE

Hereinafter, the present embodiment will be specifically described with reference to Examples and Comparative Examples. However, the present embodiment is not limited to the following Examples.

Example 1

A photomask blank was produced, the photomask blank having a film including a material containing chromium laminated on a transparent substrate made of quartz that is 152-mm square and has a thickness of about 6 mm.

Firstly, a third layer constituted by CrON was formed on the transparent substrate by using a chromium target as a target and adjusting the power applied to the target, while at the same time, using an argon gas, a nitrogen gas, and an oxygen gas as sputtering gases. Next, a second layer constituted by CrN was formed by using a chromium target as a target and adjusting the power applied to the target, while at the same time, using an argon gas and a nitrogen gas as sputtering gases. Next, a first layer constituted by CrON was formed by using a chromium target and adjusting the power applied to the target, while at the same time, using an argon gas, a nitrogen gas, and an oxygen gas as sputtering gases to obtain a photomask blank having no resist film, as in FIG. 1. The compositions of the first layer, the second layer, and the third layer and the thicknesses of the first layer, the second layer, and the third layer are shown in Table 1.

Note that the composition was measured using an X-ray photoelectron spectrometer K-Alpha manufactured by Thermo Fisher Scientific K.K., and the thickness of the film (layer) was measured using a stylus profiler P-16+ manufactured by KLA-Tencor Corporation (the same hereinafter).

Example 2

In the second layer, the chromium content (atom %) was reduced and the nitrogen content (atom %) was increased from Example 1. In other respects, a film including a material containing chromium was formed on a transparent substrate in the same manner as in Example 1 to obtain a photomask blank having no resist film.

The compositions of the first layer, the second layer, and the third layer and the thicknesses of the first layer, the second layer, and the third layer are shown in Table 1.

Example 3

In the second layer, the chromium content (atom %) was reduced and the nitrogen content (atom %) was increased from Example 1. In other respects, a film including a material containing chromium was formed on a transparent substrate in the same manner as in Example 1 to obtain a photomask blank having no resist film.

The compositions of the first layer, the second layer, and the third layer and the thicknesses of the first layer, the second layer, and the third layer are shown in Table 1.

Example 4

In the second layer, the chromium content (atom %) was reduced and the nitrogen content (atom %) was increased from Example 1. In other respects, a film including a material containing chromium was formed on a transparent substrate in the same manner as in Example 1 to obtain a photomask blank having no resist film.

The compositions of the first layer, the second layer, and the third layer and the thicknesses of the first layer, the second layer, and the third layer are shown in Table 1.

Example 5

Except that the first layer was made thicker than in Example 4, a film including a material containing chromium was formed on a transparent substrate in the same manner as in Example 4 to obtain a photomask blank having no resist film.

The compositions of the first layer, the second layer, and the third layer and the thicknesses of the first layer, the second layer, and the third layer are shown in Table 1.

Comparative Example 1

A first layer and a third layer were made from chromium oxide (CrO) instead of chromium oxynitride (CrON) and a second layer was made from chromium oxide (CrO) instead of chromium nitride (CrN). Other than the compositions of the first layer, the second layer, and the third layer, a film including a material containing chromium was formed on a transparent substrate in the same manner as in Example 1 to obtain a photomask blank having no resist film.

The compositions of the first layer, the second layer, and the third layer and the thicknesses of the first layer, the second layer, and the third layer are shown in Table 1.

Comparative Example 2

In the second layer, the chromium content (atom %) was increased and the nitrogen content (atom %) was reduced from Example 1. Other than that, a film including a material containing chromium was formed on a transparent substrate in the same manner as in Example 1 to obtain a photomask blank having no resist film.

The compositions of the first layer, the second layer, and the third layer and the thicknesses of the first layer, the second layer, and the third layer are shown in Table 1.

Comparative Example 3

In the second layer, the chromium content (atom %) was reduced and the nitrogen content (atom %) was increased from Example 1. Other than that, a film including a material containing chromium was formed on a transparent substrate in the same manner as in Example 1 to obtain a photomask blank having no resist film.

The compositions of the first layer, the second layer, and the third layer and the thicknesses of the first layer, the second layer, and the third layer are shown in Table 1.

Comparative Example 4

The first layer was made thicker than in Example 4, but otherwise, a film including a material containing chromium was formed on a transparent substrate in the same manner as in Example 4 to obtain a photomask blank having no resist film.

The compositions of the first layer, the second layer, and the third layer and the thicknesses of the first layer, the second layer, and the third layer are shown in Table 1.

Comparative Example 5

The first layer was made thinner than in Example 4, but otherwise, a film including a material containing chromium was formed on a transparent substrate in the same manner as in Example 4 to obtain a photomask blank having no resist film.

The compositions of the first layer, the second layer, and the third layer and the thicknesses of the first layer, the second layer, and the third layer are shown in Table 1.

(Regarding Surface Roughness)

Next, to evaluate the surface roughness Rq of the films including a material containing chromium, evaluation was carried out using the photomask blanks obtained in Example 1, Example 2, Example 3, Example 4, Example 5, Comparative Example 1, Comparative Example 2, Comparative Example 3, Comparative Example 4, and Comparative Example 5.

The surface roughness Rq of the films including a material containing chromium was evaluated using NanoScope V/Dimension Icon manufactured by Bruker AXS, Inc.

Table 2 shows the results.

As shown in Table 2, it was observed that compared with the photomask blanks of Comparative Example 1 and Comparative Example 2, the photomask blanks of Example 1, Example 2, Example 3, Example 4, and Example 5, which are photomask blanks of the present embodiment, had good surface roughness Rq.

It can be conjectured that this is because unlike the photomask blank of Comparative Example 1, the photomask blanks of Example 1, Example 2, Example 3, Example 4, and Example 5 had chromium oxynitride, which allows good surface roughness Rq, formed on the surface.

It can also be conjectured that the above was caused by chromium nitride, which is comparatively nitrogen-rich and has good surface roughness Rq, being formed as the second layer in the photomask blanks of Example 1, Example 2, Example 3, Example 4, and Example 5 unlike in Comparative Example 2.

(Regarding Reflectance)

Next, to evaluate the reflectance of the films including a material containing chromium at a wavelength of 355 nm and a wavelength of 400 nm, evaluation was carried out using the photomask blanks obtained in Example 1, Example 2, Example 3, Example 4, Example 5, Comparative Example 1, Comparative Example 2, Comparative Example 3, Comparative Example 4, and Comparative Example 5.

The reflectance to a wavelength of 355 nm and a wavelength of 400 nm was measured using an ultraviolet/visible/near-infrared spectrophotometer SolidSpec-3700 manufactured by Shimadzu Corp.

Table 3 shows the results.

As shown in Table 3, it was observed that the photomask blanks of Comparative Example 2 and Comparative Example 5 each had a reflectance higher than 32% to a wavelength of 355 nm, whereas the photomask blanks of Example 1, Example 2, Example 3, Example 4, and Example 5 each had a reflectance of 32% or less to a wavelength of 355 nm.

This can be considered to be because unlike in Comparative Example 2, a layer that was comparatively nitrogen-rich and had a low reflectance to a wavelength of 355 nm was formed as the second layer in the photomask blanks of Example 1, Example 2, Example 3, Example 4, and Example 5.

It can be considered that unlike Comparative Example 5, the first layer of the photomask blank was thick in Example 1, Example 2, Example 3, Example 4, and Example 5, so that the first layer was not excessively affected by the second layer, which had a comparatively high reflectance, and that therefore, reflectance was low. It can be considered that the first layer in Comparative Example 5 was too thin, and was overly affected.

Meanwhile, it was observed that the photomask blank of Comparative Example 3 had a low reflectance lower than 27% to a wavelength of 400 nm, whereas the photomask blanks of Example 1, Example 2, Example 3, Example 4, and Example 5 each had a reflectance 27% or higher to a wavelength of 400 nm. This can be considered to be because unlike in Comparative Example 3, the composition of the chromium nitride in the second layer of the photomask blank was adjusted so that the reflectance on the film thickness to a wavelength of 400 nm was 27% or higher in Example 1, Example 2, Example 3, Example 4, and Example 5.

(Regarding Resistivity)

Next, to evaluate the resistivity of the films including a material containing chromium, evaluation was carried out using the photomask blanks obtained in Example 1, Example 2, Example 3, Example 4, Example 5, Comparative Example 1, Comparative Example 2, Comparative Example 3, Comparative Example 4, and Comparative Example 5.

The resistivity of the chromium films was evaluated using a resistivity meter MCP-T600 manufactured by Mitsubishi Chemical Corporation.

Table 4 shows the results.

As shown in Table 4, it was observed that compared with the photomask blanks of Comparative Example 1, Comparative Example 3, and Comparative Example 4, the photomask blanks of Example 1, Example 2, Example 3, Example 4, and Example 5, which are photomask blanks of the present embodiment, had a low resistivity in the films.

This can be considered to be because compared with Comparative Example 1 and Comparative Example 3, comparatively nitrogen-rich chromium nitride having good conductivity was formed as the second layer of the photomask blank in Example 1, Example 2, Example 3, Example 4, and Example 5.

It can also be considered that compared with Comparative Example 4, the film thickness of the first layer of the photomask blank was made thin, i.e. 20 nm or less in Example 1, Example 2, Example 3, Example 4, and Example 5, so that the first layer was influenced by the second layer, having good conductivity.

(Regarding Detection Limit)

Next, to evaluate the detection limit of the films including a material containing chromium by using a photomask blank inspection apparatus, evaluation was carried out using the photomask blanks obtained in Example 1, Example 2, Example 3, Example 4, Example 5, Comparative Example 1, Comparative Example 2, Comparative Example 3, Comparative Example 4, and Comparative Example 5.

On each of the photomask blanks obtained in Example 1, Example 2, Example 3, Example 4, Example 5, Comparative Example 1, Comparative Example 2, Comparative Example 3, Comparative Example 4, and Comparative Example 5, 1000 PSL (polystyrene latex) standard particles having the same size were arranged in a 1 cm×1 cm region at regular intervals. The region in which the PSL standard particles were arranged was inspected by a photomask blank inspection apparatus having an inspection wavelength of 355 nm. The size of the PSL standard particles was altered from 70 nm to 40 nm by 2 nm, and arranged on the photomask blank. For each of the PSL standard particles having different sizes, the number of defects detected by the photomask blank inspection apparatus was evaluated, and when 95% or more of the 1000 PSL standard particles arranged were detected, the PSL standard particles were evaluated as detectable. When the number of detected PSL standard particles was less than 95% of the number of the 1000 PSL standard particles arranged, the PSL standard particles were evaluated as undetectable, and the size of the PSL standard particles at which the detected number did not fall below 95% was defined as the detection limit.

Table 5 shows the results.

As shown in Table 5, it was observed that compared with the photomask blanks of Comparative Example 1, Comparative Example 2, and Comparative Example 5, the photomask blanks of Example 1, Example 2, Example 3, Example 4, and Example 5 had small defect detection limits, and it was possible to detect smaller defects.

This can be considered to be because as shown in Table 2, the photomask blanks of Example 1, Example 2, Example 3, Example 4, and Example 5 have a small surface roughness Rq compared with the photomask blanks of Comparative Example 1 and Comparative Example 2.

The above can also be considered to be because the photomask blanks of Example 1, Example 2, Example 3, Example 4, and Example 5 have lower reflectance to inspection light having a wavelength of 355 nm compared with Comparative Example 5.

(Regarding Adherence of Foreign Matter)

Next, to evaluate the amount of foreign matter adhered to the photomask blanks inside a photomask production apparatus, the photomask blanks obtained in Example 1, Example 2, Example 3, Example 4, Example 5, Comparative Example 1, Comparative Example 2, Comparative Example 3, Comparative Example 4, and Comparative Example 5 were used.

Firstly, the photomask blanks obtained in Example 1, Example 2, Example 3, Example 4, Example 5, Comparative Example 1, Comparative Example 2, Comparative Example 3, Comparative Example 4, and Comparative Example 5 were inspected by a photomask blank inspection apparatus having an inspection wavelength of 355 nm.

Subsequently, the photomask blanks obtained in Example 1, Example 2, Example 3, Example 4, Example 5, Comparative Example 1, Comparative Example 2, Comparative Example 3, Comparative Example 4, and Comparative Example 5 were transported from the loader of the photomask production apparatus into a treatment chamber, and then returned to the loader again without performing a treatment. This operation was repeated 20 times.

After that, the photomask blanks obtained in Example 1, Example 2, Example 3, Example 4, Example 5, Comparative Example 1, Comparative Example 2, Comparative Example 3, Comparative Example 4, and Comparative Example 5 were inspected again by the photomask blank inspection apparatus having the inspection wavelength of 355 nm to investigate the number of incremental defects.

Table 6 shows the results.

As shown in Table 6, it was observed that more foreign matter adhered to the photomask blanks of Example 1, Example 2, Example 3, Example 4, and Example 5 than the photomask blanks of Comparative Example 1, Comparative Example 3, Comparative Example 4, and Comparative Example 5.

This is because as shown in Table 4, the films of the photomask blanks of Example 1, Example 2, Example 3, Example 4, and Example 5 have a lower resistivity compared with Comparative Example 1, Comparative Example 3, and Comparative Example 4.

It can also be considered that the above is caused by the photomask blanks of Example 1, Example 2, Example 3, Example 4, and Example 5 having smaller detection limits than the photomask blank of Comparative Example 5 as shown in Table 5.

TABLE 1

|  |  | Content (atom %) | | | Thickness | Total thickness |
| --- | --- | --- | --- | --- | --- | --- |
|  |  | Chromium | Oxygen | Nitrogen | (nm) | (nm) |
| Example 1 | First layer | 41.2 | 34.4 | 24.4 | 14 | 84 |
|  | Second layer | 86.1 | 0.0 | 13.9 | 65 |  |
|  | Third layer | 41.2 | 34.4 | 24.4 | 5 |  |
| Example 2 | First layer | 41.2 | 34.4 | 24.4 | 14 | 84 |
|  | Second layer | 84.1 | 0.0 | 15.9 | 65 |  |
|  | Third layer | 41.2 | 34.4 | 24.4 | 5 |  |
| Example 3 | First layer | 41.2 | 34.4 | 24.4 | 14 | 84 |
|  | Second layer | 80.3 | 0.0 | 19.7 | 65 |  |
|  | Third layer | 41.2 | 34.4 | 24.4 | 5 |  |
| Example 4 | First layer | 41.2 | 34.4 | 24.4 | 14 | 84 |
|  | Second layer | 72.6 | 0.0 | 27.4 | 65 |  |
|  | Third layer | 41.2 | 34.4 | 24.4 | 5 |  |
| Example 5 | First layer | 41.2 | 34.4 | 24.4 | 18 | 88 |
|  | Second layer | 72.6 | 0.0 | 27.4 | 65 |  |
|  | Third layer | 41.2 | 34.4 | 24.4 | 5 |  |

TABLE 1-continued

|  |  | Content (atom %) | | | Thickness (nm) | Total thickness (nm) |
| --- | --- | --- | --- | --- | --- | --- |
|  |  | Chromium | Oxygen | Nitrogen |  |  |
| Comparative Example 1 | First layer | 40.0 | 60.0 | 0.0 | 14 | 84 |
|  | Second layer | 95.0 | 5.0 | 0.0 | 65 |  |
|  | Third layer | 80.0 | 20.0 | 0.0 | 5 |  |
| Comparative Example 2 | First layer | 41.2 | 34.4 | 24.4 | 14 | 84 |
|  | Second layer | 96.0 | 0.0 | 4.0 | 65 |  |
|  | Third layer | 41.2 | 34.4 | 24.4 | 5 |  |
| Comparative Example 3 | First layer | 41.2 | 34.4 | 24.4 | 14 | 84 |
|  | Second layer | 60.0 | 0.0 | 40.0 | 65 |  |
|  | Third layer | 41.2 | 34.4 | 24.4 | 5 |  |
| Comparative Example 4 | First layer | 41.2 | 34.4 | 24.4 | 26 | 96 |
|  | Second layer | 72.6 | 0.0 | 27.4 | 65 |  |
|  | Third layer | 41.2 | 34.4 | 24.4 | 5 |  |
| Comparative Example 5 | First layer | 41.2 | 34.4 | 24.4 | 6 | 76 |
|  | Second layer | 72.6 | 0.0 | 27.4 | 65 |  |
|  | Third layer | 41.2 | 34.4 | 24.4 | 5 |  |

TABLE 2

|  | Surface roughness Rq [nm] | Difference [nm] in surface roughness Rq [nm] from Comparative Example 1 | Difference [nm] in surface roughness Rq [nm] from Comparative Example 2 |
| --- | --- | --- | --- |
| Example 1 | 1.3 | −0.6 | −0.4 |
| Example 2 | 1.2 | −0.7 | −0.5 |
| Example 3 | 1.1 | −0.8 | −0.6 |
| Example 4 | 0.8 | −1.1 | −0.9 |
| Example 5 | 0.7 | −1.2 | −1.0 |
| Comparative Example 1 | 1.9 | 0.0 | 0.2 |
| Comparative Example 2 | 1.7 | −0.2 | 0.0 |
| Comparative Example 3 | 0.7 | −1.2 | −1.0 |
| Comparative Example 4 | 0.6 | −1.3 | −1.1 |
| Comparative Example 5 | 1.3 | −0.6 | −0.4 |

TABLE 3

|  | Reflectance [%] to wavelength of 355 nm | Difference [%] in reflectance [%] to wavelength of 355 nm from Comparative Example 2 | Difference [%] in reflectance [%] to wavelength of 355 nm from Comparative Example 5 | Reflectance [%] to wavelength of 400 nm | Difference [%] in reflectance [%] to wavelength of 400 nm from Comparative Example 3 |
| --- | --- | --- | --- | --- | --- |
| Example 1 | 28.0 | −7.0 | −6.0 | 33.0 | 12.0 |
| Example 2 | 27.0 | −8.0 | −7.0 | 32.0 | 11.0 |
| Example 3 | 26.8 | −8.2 | −7.2 | 31.5 | 10.5 |
| Example 4 | 26.7 | −8.3 | −7.3 | 31.3 | 10.3 |
| Example 5 | 24.0 | −11.0 | −10.0 | 31.0 | 10.0 |
| Comparative Example 1 | 21.1 | −13.9 | −12.9 | 26.7 | 5.7 |
| Comparative Example 2 | 35.0 | 0.0 | 1.0 | 40.0 | 19.0 |
| Comparative Example 3 | 24.1 | −10.9 | −9.9 | 21.0 | 0.0 |
| Comparative Example 4 | 21.5 | −13.5 | −12.5 | 28.4 | 7.4 |
| Comparative Example 5 | 34.0 | −1.0 | 0.0 | 34.1 | 13.1 |

TABLE 4

| | Resistivity [Ω/□] of film | Difference [Ω/□] in resistivity [Ω/□] of film from Comparative Example 1 | Difference [Ω/□] in resistivity [Ω/□] of film from Comparative Example 3 | Difference [Ω/□] in resistivity [Ω/□] of film from Comparative Example 4 |
|---|---|---|---|---|
| Example 1 | 14 | −1186.0 | −16.0 | −11.0 |
| Example 2 | 15 | −1185.0 | −15.0 | −10.0 |
| Example 3 | 16 | −1184.0 | −14.0 | −9.0 |
| Example 4 | 17 | −1183.0 | −13.0 | −8.0 |
| Example 5 | 19 | −1181.0 | −11.0 | −6.0 |
| Comparative Example 1 | 1200 | 0.0 | 1170.0 | 1175.0 |
| Comparative Example 2 | 13 | −1187.0 | −17.0 | −12.0 |
| Comparative Example 3 | 30 | −1170.0 | 0.0 | 5.0 |
| Comparative Example 4 | 25 | −1175.0 | −5.0 | 0.0 |
| Comparative Example 5 | 15 | −1185.0 | −15.0 | −10.0 |

TABLE 5

| | Detection limit [nm] | Difference [nm] in detection limit [nm] from Comparative Example 1 | Difference [nm] in detection limit [nm] from Comparative Example 2 | Difference [nm] in detection limit [nm] from Comparative Example 5 |
|---|---|---|---|---|
| Example 1 | 50 | −16.0 | −10.0 | −6.0 |
| Example 2 | 48 | −18.0 | −12.0 | −8.0 |
| Example 3 | 46 | −20.0 | −14.0 | −10.0 |
| Example 4 | 44 | −22.0 | −16.0 | −12.0 |
| Example 5 | 42 | −24.0 | −18.0 | −14.0 |
| Comparative Example 1 | 66 | 0.0 | 6.0 | 10.0 |
| Comparative Example 2 | 60 | −6.0 | 0.0 | 4.0 |
| Comparative Example 3 | 42 | −24.0 | −18.0 | −14.0 |
| Comparative Example 4 | 40 | −26.0 | −20.0 | −16.0 |
| Comparative Example 5 | 56 | −10.0 | −4.0 | 0.0 |

TABLE 6

| | Number of incremental defects | Difference in number of incremental defects from Comparative Example 1 | Difference in number of incremental defects from Comparative Example 3 | Difference in number of incremental defects from Comparative Example 4 | Difference in number of incremental defects from Comparative Example 5 |
|---|---|---|---|---|---|
| Example 1 | 50 | 36 | 26 | 26 | 22 |
| Example 2 | 47 | 33 | 23 | 23 | 19 |
| Example 3 | 44 | 30 | 20 | 20 | 16 |
| Example 4 | 52 | 38 | 28 | 28 | 24 |
| Example 5 | 34 | 20 | 10 | 10 | 6 |
| Comparative Example 1 | 14 | 0 | −10 | −10 | −14 |
| Comparative Example 2 | 56 | 42 | 32 | 32 | 28 |
| Comparative Example 3 | 24 | 10 | 0 | 0 | −4 |
| Comparative Example 4 | 24 | 10 | 0 | 0 | −4 |
| Comparative Example 5 | 28 | 14 | 4 | 4 | 0 |

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A photomask blank comprising:
a substrate; and
a film including a material containing chromium, wherein
the film including a material containing chromium consists of a first layer, a second layer, and a third layer from a side remote from the substrate,
the first layer, the second layer, and the third layer all contain chromium,
the first layer consists of chromium, oxygen and nitrogen and has a chromium content of 44 atom % or less, an oxygen content of 30 atom % or more, a nitrogen content of 26 atom % or less, and a thickness of 8 nm or more and 20 nm or less,
the second layer consists of chromium and nitrogen and has a chromium content of 66 atom % or more and 92 atom % or less, a nitrogen content of 8 atom % or more and 34 atom % or less, and a thickness of 40 nm or more and 70 nm or less, and
the third layer consists of chromium, oxygen and nitrogen and has a chromium content of 44 atom % or less, an oxygen content of 30 atom % or more, a nitrogen content of 26 atom % or less, and a thickness of 10 nm or less.

2. The photomask blank according to claim 1, wherein the film including a material containing chromium is a light-shielding film and has a reflectance of 32% or lower to exposure light having a wavelength of 355 nm and a reflectance of 27% or higher to exposure light having a wavelength of 400 nm.

3. The photomask blank according to claim 2, wherein the film including a material containing chromium has a film thickness of 53 nm or more and 100 nm or less.

4. The photomask blank according to claim 3, wherein the film including a material containing chromium has a resistivity of 20Ω/□ or lower.

5. The photomask blank according to claim 4, further comprising a reverse side film on a side of the substrate opposite to a side having the film including a material containing chromium, wherein
the reverse side film has a first reverse side layer, a second reverse side layer, and a third reverse side layer from a side remote from the substrate,
the first reverse side layer, the second reverse side layer, and the third reverse side layer all contain chromium,
the first reverse side layer consists of chromium, oxygen and nitrogen and has a chromium content of 44 atom % or less, an oxygen content of 30 atom % or more, a nitrogen content of 26 atom % or less, and a thickness of 8 nm or more and 20 nm or less,
the second reverse side layer consists of chromium and nitrogen and has a chromium content of 66 atom % or more and 92 atom % or less, a nitrogen content of 8 atom % or more and 34 atom % or less, and a thickness of 40 nm or more and 70 nm or less, and
the third reverse side layer consists of chromium, oxygen and nitrogen and has a chromium content of 44 atom % or less, an oxygen content of 30 atom % or more, a nitrogen content of 26 atom % or less, and a thickness of 10 nm or less.

6. The photomask blank according to claim 3, further comprising a reverse side film on a side of the substrate opposite to a side having the film including a material containing chromium, wherein
the reverse side film has a first reverse side layer, a second reverse side layer, and a third reverse side layer from a side remote from the substrate,
the first reverse side layer, the second reverse side layer, and the third reverse side layer all contain chromium,
the first reverse side layer consists of chromium, oxygen and nitrogen and has a chromium content of 44 atom % or less, an oxygen content of 30 atom % or more, a nitrogen content of 26 atom % or less, and a thickness of 8 nm or more and 20 nm or less,
the second reverse side layer consists of chromium and nitrogen and has a chromium content of 66 atom % or more and 92 atom % or less, a nitrogen content of 8 atom % or more and 34 atom % or less, and a thickness of 40 nm or more and 70 nm or less, and
the third reverse side layer consists of chromium, oxygen and nitrogen and has a chromium content of 44 atom % or less, an oxygen content of 30 atom % or more, a nitrogen content of 26 atom % or less, and a thickness of 10 nm or less.

7. The photomask blank according to claim 2, wherein the film including a material containing chromium has a resistivity of 20Ω/□ or lower.

8. The photomask blank according to claim 7, further comprising a reverse side film on a side of the substrate opposite to a side having the film including a material containing chromium, wherein
the reverse side film has a first reverse side layer, a second reverse side layer, and a third reverse side layer from a side remote from the substrate,
the first reverse side layer, the second reverse side layer, and the third reverse side layer all contain chromium,
the first reverse side layer consists of chromium, oxygen and nitrogen and has a chromium content of 44 atom % or less, an oxygen content of 30 atom % or more, a nitrogen content of 26 atom % or less, and a thickness of 8 nm or more and 20 nm or less,
the second reverse side layer consists of chromium and nitrogen and has a chromium content of 66 atom % or more and 92 atom % or less, a nitrogen content of 8 atom % or more and 34 atom % or less, and a thickness of 40 nm or more and 70 nm or less, and
the third reverse side layer consists of chromium, oxygen and nitrogen and has a chromium content of 44 atom % or less, an oxygen content of 30 atom % or more, a nitrogen content of 26 atom % or less, and a thickness of 10 nm or less.

9. The photomask blank according to claim 2, further comprising a reverse side film on a side of the substrate opposite to a side having the film including a material containing chromium, wherein
the reverse side film has a first reverse side layer, a second reverse side layer, and a third reverse side layer from a side remote from the substrate,
the first reverse side layer, the second reverse side layer, and the third reverse side layer all contain chromium,
the first reverse side layer consists of chromium, oxygen and nitrogen and has a chromium content of 44 atom % or less, an oxygen content of 30 atom % or more, a nitrogen content of 26 atom % or less, and a thickness of 8 nm or more and 20 nm or less,
the second reverse side layer consists of chromium and nitrogen and has a chromium content of 66 atom % or more and 92 atom % or less, a nitrogen content of 8 atom % or more and 34 atom % or less, and a thickness of 40 nm or more and 70 nm or less, and the third reverse side layer consists of chromium, oxygen and nitrogen and has a chromium content of 44 atom % or less, an oxygen content of 30 atom % or more, a nitrogen content of 26 atom % or less, and a thickness of 10 nm or less.

10. The photomask blank according to claim 1, wherein the film including a material containing chromium has a film thickness of 53 nm or more and 100 nm or less.

11. The photomask blank according to claim 10, wherein the film including a material containing chromium has a resistivity of 20Ω/□ or lower.

12. The photomask blank according to claim 11, further comprising a reverse side film on a side of the substrate opposite to a side having the film including a material containing chromium, wherein the reverse side film has a first reverse side layer, a second reverse side layer, and a third reverse side layer from a side remote from the substrate, the first reverse side layer, the second reverse side layer, and the third reverse side layer all contain chromium, the first reverse side layer consists of chromium, oxygen and nitrogen and has a chromium content of 44 atom % or less, an oxygen content of 30 atom % or more, a nitrogen content of 26 atom % or less, and a thickness of 8 nm or more and 20 nm or less, the second reverse side layer consists of chromium and nitrogen and has a chromium content of 66 atom % or more and 92 atom % or less, a nitrogen content of 8 atom % or more and 34 atom % or less, and a thickness of 40 nm or more and 70 nm or less, and the third reverse side layer consists of chromium, oxygen and nitrogen and has a chromium content of 44 atom % or less, an oxygen content of 30 atom % or more, a nitrogen content of 26 atom % or less, and a thickness of 10 nm or less.

13. The photomask blank according to claim 10, further comprising a reverse side film on a side of the substrate opposite to a side having the film including a material containing chromium, wherein the reverse side film has a first reverse side layer, a second reverse side layer, and a third reverse side layer from a side remote from the substrate, the first reverse side layer, the second reverse side layer, and the third reverse side layer all contain chromium, the first reverse side layer consists of chromium, oxygen and nitrogen and has a chromium content of 44 atom % or less, an oxygen content of 30 atom % or more, a nitrogen content of 26 atom % or less, and a thickness of 8 nm or more and 20 nm or less, the second reverse side layer consists of chromium and nitrogen and has a chromium content of 66 atom % or more and 92 atom % or less, a nitrogen content of 8 atom % or more and 34 atom % or less, and a thickness of 40 nm or more and 70 nm or less, and the third reverse side layer consists of chromium, oxygen and nitrogen and has a chromium content of 44 atom % or less, an oxygen content of 30 atom % or more, a nitrogen content of 26 atom % or less, and a thickness of 10 nm or less.

14. The photomask blank according to claim 1, wherein the film including a material containing chromium has a resistivity of 20Ω/□ or lower.

15. The photomask blank according to claim 14, further comprising a reverse side film on a side of the substrate opposite to a side having the film including a material containing chromium, wherein the reverse side film has a first reverse side layer, a second reverse side layer, and a third reverse side layer from a side remote from the substrate, the first reverse side layer, the second reverse side layer, and the third reverse side layer all contain chromium, the first reverse side layer consists of chromium, oxygen and nitrogen and has a chromium content of 44 atom % or less, an oxygen content of 30 atom % or more, a nitrogen content of 26 atom % or less, and a thickness of 8 nm or more and 20 nm or less, the second reverse side layer consists of chromium and nitrogen and has a chromium content of 66 atom % or more and 92 atom % or less, a nitrogen content of 8 atom % or more and 34 atom % or less, and a thickness of 40 nm or more and 70 nm or less, and the third reverse side layer consists of chromium, oxygen and nitrogen and has a chromium content of 44 atom % or less, an oxygen content of 30 atom % or more, a nitrogen content of 26 atom % or less, and a thickness of 10 nm or less.

16. The photomask blank according to claim 1, further comprising a reverse side film on a side of the substrate opposite to a side having the film including a material containing chromium, wherein the reverse side film has a first reverse side layer, a second reverse side layer, and a third reverse side layer from a side remote from the substrate, the first reverse side layer, the second reverse side layer, and the third reverse side layer all contain chromium, the first reverse side layer consists of chromium, oxygen and nitrogen and has a chromium content of 44 atom % or less, an oxygen content of 30 atom % or more, a nitrogen content of 26 atom % or less, and a thickness of 8 nm or more and 20 nm or less, the second reverse side layer consists of chromium and nitrogen and has a chromium content of 66 atom % or more and 92 atom % or less, a nitrogen content of 8 atom % or more and 34 atom % or less, and a thickness of 40 nm or more and 70 nm or less, and the third reverse side layer consists of chromium, oxygen and nitrogen and has a chromium content of 44 atom % or less, an oxygen content of 30 atom % or more, a nitrogen content of 26 atom % or less, and a thickness of 10 nm or less.

17. A method for producing a photomask having a circuit pattern of the film including a material containing chromium from the photomask blank according to claim 1, the method comprising the steps of:

(A) forming a resist film on the film including a material containing chromium on a side remote from the substrate;

(B) forming a resist pattern corresponding to the circuit pattern by patterning the resist film;

(C) forming a pattern corresponding to the circuit pattern in the film including a material containing chromium by dry-etching the film including a material containing chromium by using a chlorine-based gas containing oxygen for patterning while using the resist pattern as an etching mask; and (D) removing the resist pattern.

18. A photomask comprising:
a substrate; and
a film including a material containing chromium, provided on the substrate and having a patterned region comprising a circuit pattern, wherein the film including a material containing chromium consists of a first layer, a second layer, and a third layer from a side remote from the substrate, the first layer, the second layer, and the third layer all contain chromium, the first layer consists of chromium, oxygen and nitrogen and has a chromium content of 44 atom % or less, an oxygen content of 30 atom % or more, a nitrogen content of 26 atom % or less, and a thickness of 8 nm or more and 20 nm or less, the second layer consists of chromium and nitrogen and has a chromium content of 66 atom % or more and 92 atom % or less, a nitrogen content of 8 atom % or more and 34 atom % or less, and a thickness of 40 nm or more and 70 nm or less, and the third layer consists of chromium, oxygen and nitrogen and has a chromium content of 44 atom % or less, an oxygen content of 30 atom % or more, a nitrogen content of 26 atom % or less, and a thickness of 10 nm or less.

* * * * *